United States Patent [19]

Kadokawa et al.

[11] Patent Number: 4,870,685

[45] Date of Patent: Sep. 26, 1989

[54] VOICE SIGNAL CODING METHOD

[75] Inventors: Yuichi Kadokawa, Tokyo; Hiroki Uchiyama, Yokohama; Wasaku Yamada, Mitaka, all of Japan

[73] Assignee: Ricoh Company, Ltd., Japan

[21] Appl. No.: 111,102

[22] Filed: Oct. 22, 1987

[30] Foreign Application Priority Data

Oct. 26, 1986 [JP] Japan ............................... 61-254078
Mar. 26, 1987 [JP] Japan ............................... 62-72662

[51] Int. Cl.⁴ ............................................ G10L 3/02

[52] U.S. Cl. ............................ 381/31; 364/513.5; 341/143; 375/122

[58] Field of Search ............................ 381/29–35; 364/513.5, 768; 375/122; 341/143

[56] References Cited

U.S. PATENT DOCUMENTS

| | | | |
|---|---|---|---|
| 4,301,333 | 11/1981 | Gillette | 381/32 |
| 4,481,659 | 11/1984 | Adoul | 381/31 |
| 4,550,425 | 10/1985 | Anderson et al. | 381/34 X |
| 4,587,669 | 5/1986 | Gillette | 381/32 |
| 4,588,986 | 5/1986 | Byrne | 364/768 |
| 4,700,360 | 10/1987 | Visser | 381/31 |

*Primary Examiner*—Peter S. Wong
*Assistant Examiner*—Emanuel Todd Voeltz
*Attorney, Agent, or Firm*—Mason, Fenwick & Lawrence

[57] ABSTRACT

A voice signal coding method for compressing voice data by coding is provided. PCM coded voice data are grouped into blocks in a timed sequence, each block having a predetermined number of data. A scale data representing a MSB corresponding to a maximum value in absolute value in each block is identified. Then, a code data is defined by a predetermined number of bits of data containing the MSB, thereby having the voice data compressed by coding. The code data is corrected such that an error between a decoded value of the code data and the original voice data corresponding to the code data is minimized. With such a correction step, the code data is refined such that a reproduced voice signal by decoding the thus corrected code data is very close to the original voice signal.

20 Claims, 8 Drawing Sheets

| | b7 | b6 | b5 | b4 (POS) | b3 | b2 | b1 | b0 | | MSB | | LSB | |
|---|---|---|---|---|---|---|---|---|---|---|---|---|---|
| | | | | | | | | | | 1 | 0 | 0 | POS |
| #1 | 0 | 0 | 0 | 1 | 0 | 1 | 0 | 1 | → | 0 | 1 | 0 | DC |
| #2 | 0 | 0 | 0 | 0 | 1 | 0 | 0 | 1 | → | 0 | 0 | 1 | DC |
| #3 | 1 | 1 | 1 | 0 | 1 | 1 | 1 | 0 | → | 1 | 0 | 1 | DC |
| #4 | 0 | 0 | 0 | 0 | 0 | 0 | 0 | 1 | → | 0 | 0 | 0 | DC |
| #5 | 0 | 0 | 0 | 0 | 0 | 0 | 0 | 1 | → | 0 | 0 | 0 | DC |
| #6 | 0 | 0 | 0 | 0 | 0 | 0 | 1 | 0 | → | 0 | 0 | 0 | DC |
| #7 | 0 | 0 | 0 | 0 | 0 | 1 | 1 | 0 | → | 0 | 0 | 0 | DC |
| #8 | 1 | 1 | 1 | 0 | 1 | 1 | 0 | 1 | → | 1 | 0 | 1 | DC |

| | b7 | b6 | b5 | b4 (POS) | b3 | b2 | b1 | b0 | | MSB | | LSB | |
|---|---|---|---|---|---|---|---|---|---|---|---|---|---|
| | | | | | | | | | | 1 | 0 | 0 | POS |
| #1 | 0 | 0 | 0 | 1 | 1 | 0 | 0 | 0 | ← | 0 | 1 | 1 | DCo |
| #2 | 0 | 0 | 0 | 0 | 1 | 0 | 0 | 0 | ← | 0 | 0 | 1 | DCo |
| #3 | 1 | 1 | 1 | 1 | 0 | 0 | 0 | 0 | ← | 1 | 1 | 0 | DCo |
| #4 | 0 | 0 | 0 | 0 | 0 | 0 | 0 | 0 | ← | 0 | 0 | 0 | DCo |
| #5 | 0 | 0 | 0 | 0 | 0 | 0 | 0 | 0 | ← | 0 | 0 | 0 | DCo |
| #6 | 0 | 0 | 0 | 0 | 0 | 0 | 0 | 0 | ← | 0 | 0 | 0 | DCo |
| #7 | 0 | 0 | 0 | 0 | 1 | 0 | 0 | 0 | ← | 0 | 0 | 1 | DCo |
| #8 | 1 | 1 | 1 | 1 | 0 | 0 | 0 | 0 | ← | 1 | 1 | 0 | DCo |

Fig. 12a
Prior Art

TRANSMISSION BITS (b5–b3); POS (b4)

| | b7 | b6 | b5 | b4 | b3 | b2 | b1 | b0 |
|---|---|---|---|---|---|---|---|---|
| #1 | 0 | 0 | 0 | 1 | 0 | 1 | 0 | 1 |
| #2 | 0 | 0 | 0 | 0 | 1 | 0 | 0 | 1 |
| #3 | 1 | 1 | 1 | 0 | 1 | 1 | 1 | 0 |
| #4 | 0 | 0 | 0 | 0 | 0 | 0 | 0 | 1 |
| #5 | 0 | 0 | 0 | 0 | 0 | 0 | 0 | 1 |
| #6 | 0 | 0 | 0 | 0 | 0 | 0 | 1 | 0 |
| #7 | 0 | 0 | 0 | 0 | 0 | 1 | 1 | 0 |
| #8 | 1 | 1 | 1 | 0 | 1 | 1 | 0 | 1 |

Fig. 12b
Prior Art

| | MSB | | LSB |
|---|---|---|---|
| POS | 1 | 0 | 0 |
| → | 0 | 1 | 0 |
| → | 0 | 0 | 1 |
| → | 1 | 0 | 1 |
| → | 0 | 0 | 0 |
| → | 0 | 0 | 0 |
| → | 0 | 0 | 0 |
| → | 0 | 0 | 0 |
| → | 1 | 0 | 1 |

Fig. 12c
Prior Art

POS
↓

| | b7 | b6 | b5 | b4 | b3 | b2 | b1 | b0 |
|---|---|---|---|---|---|---|---|---|
| #1 | 0 | 0 | 0 | 1 | 0 | 0 | 0 | 0 |
| #2 | 0 | 0 | 0 | 0 | 1 | 0 | 0 | 0 |
| #3 | 1 | 1 | 1 | 0 | 1 | 0 | 0 | 0 |
| #4 | 0 | 0 | 0 | 0 | 0 | 0 | 0 | 0 |
| #5 | 0 | 0 | 0 | 0 | 0 | 0 | 0 | 0 |
| #6 | 0 | 0 | 0 | 0 | 0 | 0 | 0 | 0 |
| #7 | 0 | 0 | 0 | 0 | 0 | 0 | 0 | 0 |
| #8 | 1 | 1 | 1 | 0 | 1 | 0 | 0 | 0 |

Fig. 20a

| | b7 | b6 | b5 | b4 | b3 | b2 | b1 | b0 |
|---|---|---|---|---|---|---|---|---|
| #1 | 0 | 0 | 0 | 1 | 0 | 1 | 0 | 1 |
| #2 | 0 | 0 | 0 | 1 | 1 | 1 | 1 | 0 |
| #3 | 0 | 0 | 0 | 0 | 1 | 1 | 0 | 0 |
| #4 | 0 | 0 | 0 | 0 | 1 | 1 | 0 | 1 |
| #5 | 0 | 0 | 0 | 0 | 1 | 1 | 1 | 0 |
| #6 | 0 | 0 | 0 | 1 | 0 | 0 | 0 | 0 |
| #7 | 0 | 0 | 0 | 1 | 0 | 1 | 1 | 0 |
| #8 | 0 | 0 | 0 | 0 | 0 | 0 | 1 | 1 |

Fig. 20b

| | b7 | b6 | b5 | b4 (POS) | b3 | b2 | b1 | b0 |
|---|---|---|---|---|---|---|---|---|
| #1 | 0 | 0 | 0 | 1 | 0 | 1 | 0 | 1 |
| #2 | 0 | 0 | 0 | 0 | 1 | 0 | 0 | 1 |
| #3 | 1 | 1 | 1 | 0 | 1 | 1 | 1 | 0 |
| #4 | 0 | 0 | 0 | 0 | 0 | 0 | 0 | 1 |
| #5 | 0 | 0 | 0 | 0 | 0 | 0 | 0 | 1 |
| #6 | 0 | 0 | 0 | 0 | 0 | 0 | 1 | 0 |
| #7 | 0 | 0 | 0 | 0 | 0 | 1 | 1 | 0 |
| #8 | 1 | 1 | 1 | 0 | 1 | 1 | 0 | 1 |

Fig. 20c

| | b7 | b6 | b5 | b4 (POS) | b3 | b2 | b1 | b0 |
|---|---|---|---|---|---|---|---|---|
| #1 | 0 | 0 | 0 | 1 | 0 | 1 | 0 | 1 |
| #2 | 0 | 0 | 0 | 0 | 0 | 1 | 1 | 0 |
| #3 | 1 | 1 | 1 | 0 | 1 | 1 | 0 | 0 |
| #4 | 1 | 1 | 1 | 1 | 1 | 1 | 0 | 1 |
| #5 | 1 | 1 | 1 | 1 | 1 | 1 | 1 | 0 |
| #6 | 0 | 0 | 0 | 0 | 0 | 0 | 0 | 0 |
| #7 | 0 | 0 | 0 | 0 | 0 | 1 | 1 | 0 |
| #8 | 1 | 1 | 1 | 0 | 1 | 0 | 1 | 1 |

Fig. 20d

| | b7 | b6 | b5 | b4 (POS) | b3 | b2 | b1 | b0 |
|---|---|---|---|---|---|---|---|---|
| #1 | 0 | 0 | 0 | 1 | 1 | 0 | 0 | 1 |
| #2 | 0 | 0 | 0 | 0 | 1 | 0 | 1 | 0 |
| #3 | 1 | 1 | 1 | 1 | 0 | 0 | 0 | 0 |
| #4 | 0 | 0 | 0 | 0 | 0 | 0 | 0 | 1 |
| #5 | 0 | 0 | 0 | 0 | 0 | 0 | 1 | 0 |
| #6 | 0 | 0 | 0 | 0 | 0 | 1 | 0 | 0 |
| #7 | 0 | 0 | 0 | 0 | 1 | 0 | 1 | 0 |
| #8 | 1 | 1 | 1 | 0 | 1 | 1 | 1 | 1 |

Fig. 20e

| | | | |
|---|---|---|---|
| POS | 1 | 0 | 0 |
| #1 | 0 | 1 | 1 |
| #2 | 0 | 0 | 1 |
| #3 | 1 | 1 | 0 |
| #4 | 0 | 0 | 0 |
| #5 | 0 | 0 | 0 |
| #6 | 0 | 0 | 0 |
| #7 | 0 | 0 | 1 |
| #8 | 1 | 0 | 1 |

Fig. 20f

| b7 | b6 | b5 | b4 (POS) | b3 | b2 | b1 | b0 |
|---|---|---|---|---|---|---|---|
| 0 | 0 | 0 | 1 | 1 | 0 | 0 | 0 |
| 0 | 0 | 0 | 0 | 1 | 0 | 0 | 0 |
| 1 | 1 | 1 | 1 | 0 | 0 | 0 | 0 |
| 0 | 0 | 0 | 0 | 0 | 0 | 0 | 0 |
| 0 | 0 | 0 | 0 | 0 | 0 | 0 | 0 |
| 0 | 0 | 0 | 0 | 0 | 0 | 0 | 0 |
| 0 | 0 | 0 | 0 | 1 | 0 | 0 | 0 |
| 1 | 1 | 1 | 0 | 1 | 0 | 0 | 0 |

Fig. 20g

| | b7 | b6 | b5 | b4 | b3 | b2 | b1 | b0 |
|---|---|---|---|---|---|---|---|---|
| #1 | 0 | 0 | 0 | 1 | 1 | 0 | 0 | 0 |
| #2 | 0 | 0 | 1 | 0 | 0 | 0 | 0 | 0 |
| #3 | 0 | 0 | 0 | 1 | 0 | 0 | 0 | 0 |
| #4 | 0 | 0 | 0 | 1 | 0 | 0 | 0 | 0 |
| #5 | 0 | 0 | 0 | 1 | 0 | 0 | 0 | 0 |
| #6 | 0 | 0 | 0 | 1 | 0 | 0 | 0 | 0 |
| #7 | 0 | 0 | 0 | 1 | 1 | 0 | 0 | 0 |
| #8 | 0 | 0 | 0 | 0 | 0 | 0 | 0 | 0 |

Fig. 22a

| | b7 | b6 | b5 | b4 | b3 | b2 | b1 | b0 |
|---|---|---|---|---|---|---|---|---|
| #1 | 0 | 0 | 0 | 1 | 0 | 1 | 0 | 1 |
| #2 | 0 | 0 | 0 | 1 | 1 | 1 | 1 | 0 |
| #3 | 0 | 0 | 0 | 0 | 1 | 1 | 0 | 0 |
| #4 | 0 | 0 | 0 | 0 | 1 | 1 | 0 | 1 |
| #5 | 0 | 0 | 0 | 0 | 1 | 1 | 1 | 0 |
| #6 | 0 | 0 | 0 | 1 | 0 | 0 | 0 | 0 |
| #7 | 0 | 0 | 0 | 1 | 0 | 1 | 1 | 0 |
| #8 | 0 | 0 | 0 | 0 | 0 | 0 | 1 | 1 |

Fig. 22b pos ↓ (b4)

| b7 | b6 | b5 | b4 | b3 | b2 | b1 | b0 |
|---|---|---|---|---|---|---|---|
| 0 | 0 | 0 | 0 | 1 | 1 | 1 | 1 |
| 0 | 0 | 0 | 0 | 1 | 0 | 0 | 1 |
| 1 | 1 | 1 | 0 | 1 | 1 | 1 | 0 |
| 0 | 0 | 0 | 0 | 0 | 0 | 0 | 1 |
| 0 | 0 | 0 | 0 | 0 | 0 | 0 | 1 |
| 0 | 0 | 0 | 0 | 0 | 0 | 1 | 0 |
| 0 | 0 | 0 | 0 | 0 | 1 | 1 | 0 |
| 1 | 1 | 1 | 0 | 1 | 1 | 0 | 1 |

Fig. 22c pos ↓ (b4)

| | b7 | b6 | b5 | b4 | b3 | b2 | b1 | b0 |
|---|---|---|---|---|---|---|---|---|
| #1 | 0 | 0 | 0 | 0 | 1 | 1 | 1 | 1 |
| #2 | 0 | 0 | 0 | 1 | 1 | 0 | 0 | 0 |
| #3 | 0 | 0 | 0 | 0 | 0 | 1 | 1 | 0 |
| #4 | 0 | 0 | 0 | 0 | 0 | 1 | 1 | 1 |
| #5 | 0 | 0 | 0 | 0 | 1 | 0 | 0 | 0 |
| #6 | 0 | 0 | 0 | 0 | 1 | 0 | 1 | 0 |
| #7 | 0 | 0 | 0 | 1 | 0 | 0 | 0 | 0 |
| #8 | 1 | 1 | 1 | 1 | 1 | 1 | 0 | 1 |

Fig. 22d pos ↓ (b4)

| b7 | b6 | b5 | b4 | b3 | b2 | b1 | b0 |
|---|---|---|---|---|---|---|---|
| 0 | 0 | 0 | 1 | 0 | 0 | 1 | 1 |
| 0 | 0 | 0 | 1 | 1 | 1 | 0 | 0 |
| 0 | 0 | 0 | 0 | 1 | 0 | 1 | 0 |
| 0 | 0 | 0 | 0 | 1 | 0 | 1 | 1 |
| 0 | 0 | 0 | 0 | 1 | 1 | 0 | 0 |
| 0 | 0 | 0 | 0 | 1 | 1 | 1 | 0 |
| 0 | 0 | 0 | 1 | 0 | 1 | 0 | 0 |
| 0 | 0 | 0 | 0 | 0 | 0 | 0 | 1 |

Fig. 22e pos ↓ (b4)

| | b7 | b6 | b5 | b4 | b3 | b2 | b1 | b0 |
|---|---|---|---|---|---|---|---|---|
| #1 | 0 | 0 | 0 | 1 | 0 | 0 | 0 | 0 |
| #2 | 0 | 0 | 0 | 1 | 1 | 0 | 0 | 0 |
| #3 | 0 | 0 | 0 | 0 | 1 | 0 | 0 | 0 |
| #4 | 0 | 0 | 0 | 0 | 1 | 0 | 0 | 0 |
| #5 | 0 | 0 | 0 | 0 | 1 | 0 | 0 | 0 |
| #6 | 0 | 0 | 0 | 0 | 1 | 0 | 0 | 0 |
| #7 | 0 | 0 | 0 | 1 | 0 | 0 | 0 | 0 |
| #8 | 0 | 0 | 0 | 0 | 0 | 0 | 0 | 0 |

Fig. 22f pos ↓ (b4)

| b7 | b6 | b5 | b4 | b3 | b2 | b1 | b0 |
|---|---|---|---|---|---|---|---|
| 0 | 0 | 0 | 1 | 0 | 0 | 0 | 0 |
| 0 | 0 | 0 | 0 | 1 | 0 | 0 | 0 |
| 1 | 1 | 1 | 1 | 0 | 0 | 0 | 0 |
| 0 | 0 | 0 | 0 | 0 | 0 | 0 | 0 |
| 0 | 0 | 0 | 0 | 0 | 0 | 0 | 0 |
| 0 | 0 | 0 | 0 | 0 | 0 | 0 | 0 |
| 0 | 0 | 0 | 0 | 1 | 0 | 0 | 0 |
| 1 | 1 | 1 | 1 | 0 | 0 | 0 | 0 |

Fig. 22g

| | | | |
|---|---|---|---|
| 1 | 0 | 0 | = pos |
| 0 | 1 | 0 | |
| 0 | 0 | 1 | |
| 1 | 1 | 0 | |
| 0 | 0 | 0 | |
| 0 | 0 | 0 | |
| 0 | 0 | 0 | |
| 0 | 0 | 1 | |
| 1 | 1 | 1 | |

Fig. 22h

| | b7 | b6 | b5 | b4 | b3 | b2 | b1 | b0 |
|---|---|---|---|---|---|---|---|---|
| #1 | 0 | 0 | 0 | 1 | 0 | 1 | 1 | 0 |
| #2 | 0 | 0 | 0 | 1 | 1 | 1 | 1 | 0 |
| #3 | 0 | 0 | 0 | 0 | 1 | 1 | 1 | 0 |
| #4 | 0 | 0 | 0 | 0 | 1 | 1 | 1 | 0 |
| #5 | 0 | 0 | 0 | 0 | 1 | 1 | 1 | 0 |
| #6 | 0 | 0 | 0 | 0 | 1 | 1 | 1 | 0 |
| #7 | 0 | 0 | 0 | 1 | 0 | 1 | 1 | 0 |
| #8 | 0 | 0 | 0 | 0 | 0 | 1 | 1 | 0 |

| | |
|---|---|
| Fig.25a | Fig.25b |

VOICE SIGNAL CODING METHOD

BACKGROUND OF THE INVENTION

1. Field of the Invention

This invention generally relates to a method for coding a voice signal, and, in particular, to a method for compressing voice data by coding.

2. Description of the Prior Art

For example, in the case of transmitting a voice signal using a high-speed digital transmission line or subjecting a voice signal to digital processing so as to store or synthesize a voice signal for use in a voice response device, it is necessary to somehow convert a voice signal into a digital signal. A voice signal is essentially an analog signal having a frequency band ranging from 0.3 to 3.4 kHz. In order to convert such a voice signal into a digital signal, use may, for example, be made of an analog-to-digital converter having an 8-bit resolution at the sampling frequency of 8 kHz (pulse-code modulation or simply PCM coding method). And, in order to restore this digital signal into the original voice signal, use may be made of a digital-to-analog converter having an 8-bit resolution at the sampling frequency of 8 kHz to convert the digital signal into an analog signal which is then passed through a low pass filter for wave-form shaping. In this case, the larger the resolution of each of the A/D and D/A converters (and thus the bit width of the PCM coding), the higher the quality of a reproduced voice.

Such a PCM-coded voice signal has a bit rate per second (data speed) of 64 kbps, and, thus, in order to transmit a voice signal having such a high bit rate, an extremely high transmission path is required. In addition, a memory of extremely large capacity is required to store such a voice signal. Accordingly, various proposals have been made to reduce the bit rate of a voice signal. One of them is the differential PCM coding method, in which differences of PCM codes adjacent in timed sequence are formed. The differential PCM coding method utilizes the redundancy based on the correlation of voice waveforms. Variations in value between adjacent samples fall in most cases in a limited dynamic range, the number of bits per sample can be reduced. In the adaptive differential pulse-code modulation coding method according to the CCITT recommendations, which is an improvement over the differential PCM coding method, the bit rate of 32 kbps has been realized.

Other proposed methods include the adaptive prediction coding method with adaptive bit allocation (APC-AB) which utilizes the non-standing characteristic of a voice signal and the linear prediction capability and the line spectrum pair (LSP) method which is based on a voice analysis/synthesis procedure. However, these adaptive PCM, APC-AB and LSP coding methods are very complicated in their coding and decoding processes, and a device for implementing such coding and decoding processes tends to be extremely expensive.

On the other hand, there is the quasi instantaneous companding method as one of high quality PCM voice transmission methods for use in telecommunication satellites. In accordance with the quasi instantaneous companding method, PCM-coded voice data are divided into blocks, each having a predetermined number of data, in timed sequence, and a scale data representing the most significant bit which corresponds to the maximum value in absolute value of a signal in each of the blocks is identified, followed by a step of forming a code data from a predetermined number of data containing the most significant bit. The quasi instantaneous companding method is relatively simple in the process of coding, and the bit number of one sample can be reduced with ease. However, the quasi instantaneous companding method is not satisfactory in efficiency.

Under the circumstances, as a possible method for improving the efficiency of the quasi instantaneous companding (compression and expansion) method, a combination of the differential PCM coding method and the quasi instantaneous companding method is conceivable. However, in general, if the quasi instantaneous companding method were simply applied to the differential PCM coding method, lost bits during compression would cause a transmission error, so that such an error would accumulate at the integrator of the receiver, thereby leading to a reception impossible condition. Described more in detail in this respect, let us consider the case in which a voice signal shown in FIG. 11*a* is to be coded according to a coding method which is defined by applying quasi instantaneous companding to the differential PCM coding method. In the first place, for the differential PCM coding, this voice signal is sampled, for example, at the sampling frequency of 8 kHz and differential values between the samples are defined. Here, a differential value between the adjacent samples is represented by an 8-bit data having a sign, i.e., an 8-bit data in the representation of 2's complement. And, under the quasi instantaneous companding conditions, one block is formed by eight samples and the transmission data per sample contains three bits. In addition, the scale data contains three bits.

Here, it is assumed that there has been obtained differential values for these eight samples #1 through #8 as shown in FIG. 12*a*. Within this block, a maximum in absolute value among the differential values is sample #1, so that the scale position POS in this case is determined as the most significant bit in the bit pattern of sample #1, which is bit 4. Thus, the value of the scale position POS becomes $(100)_2$. Accordingly, the transmission bits of each sample (transmission data or code data) include three bits of data from bit 5, which is located one bit higher than the scale position POS and indicates a sign (sign bit), to bit 3, i.e., bits 5, 4 and 3. As a result, in this block, a transmission data (code data) formed by arranging the scale position POS at the beginning and then the transmission bits of samples #1 through #8 in sequence has a structure as shown in FIG. 12*b*.

When decoding such a coded data, in the first place, the coded data of one block is decomposed three bits by three bits, and the scale position POS is identified by the first three bits. And, then, when expanding the following 3-bit coded data into an 8-bit data, the MSB bit of the coded data is arranged at a bit position which is one bit higher than the scale position POS with the value of the sign bit set in each of the bits higher than the MSB bit and with "0" set in each of the bits lower than the LSB bit. As a result, there is obtained the decoded data as shown in FIG. 12*c*. A comparison of this decoded data with the data prior to coding indicates the fact that the information of those bits which are lower than the transmission bits (d.c. component) is lost in the decoded data (see FIG.. 11*b*). That is, a loss of bits of information has taken place.

When a voice signal is reproduced on the basis of such a coded data with a loss of bits of information, a negative d.c. shift takes place due to accumulation of errors corresponding to the amount of lost bits, as shown by the one-dotted line in FIG. 11*c*, thereby producing a waveform which is shifted in position downward to the right as compared with the original waveform shown by the dotted line in FIG. 11*c*. As a result, information cannot be reconstructed properly. As one method to cope with this situation, there has been proposed "Differential Companding PCM (DC-PCM) Due To Accumulation of Lost Bits", Takahashi et al., Transactions of Electronics Communication Society, '84/10, vol. J67-B, No. 10. However, this proposed method is effective in compressing differential data in the order of 15 bits into compressed data in the order of 8 bits, but cannot be applied to a low bit rate coding method for compressing differential data in the order of 8 bits into compressed data in the order of 3 bits. That is, in the case of such a low bit rate, if the amplitude of a voice waveform changes significantly between blocks, there is a case when the scale position changes significantly between blocks. For this reason, there is a case when the accumulated error signal becomes larger in value than the effective data to be transmitted. In such a case, the data to be transmitted is overshadowed by the error signal, so that a proper data transmission cannot be carried out.

SUMMARY OF THE INVENTION

In accordance with the principle of the present invention, a compression data obtained by a quasi instantaneous companding step is corrected within the quantized bits such that it becomes closest to the original signal.

It is therefore a primary object of the present invention to obviate the disadvantages of the prior art as described above and to provide an improved voice signal coding method.

Another object of the present invention is to provide an improved voice signal coding method which allows to reproduce a voice of high quality at a low bit rate.

A further object of the present invention is to provide an improved voice signal coding method capable of compressing a voice signal at high fidelity.

A still further object of the present invention is to provide an improved voice singal compression coding method simple in structure and yet high in performance.

Other objects, advantages and novel features of the present invention will become apparent from the following detailed description of the invention when considered in conjunction with the accompanying drawings.

BRIEF DESCRIPTION OF THE DRAWINGS

FIGS. 6*a* through 6*d* are illustrations which are useful for understanding how the optimization is carried out;

FIGS. 11*a* through 11*c* and FIGS. 12*a* through 12*c* are illustrations which are useful for explaining the typical prior art voice signal compression coding method;

FIGS. 20*a* through 20*g* are schematic illustrations which are useful for understanding the principle of the operation of the quasi instantaneous compression processing in accordance with a still further embodiment of the present invention;

FIGS. 22*a* through 22*h* are schematic illustrations which are useful for understanding the operation of the system shown in FIGS. 21*a* and 21*b*;

DESCRIPTION OF THE PREFERRED EMBODIMENTS

Figure 1A:
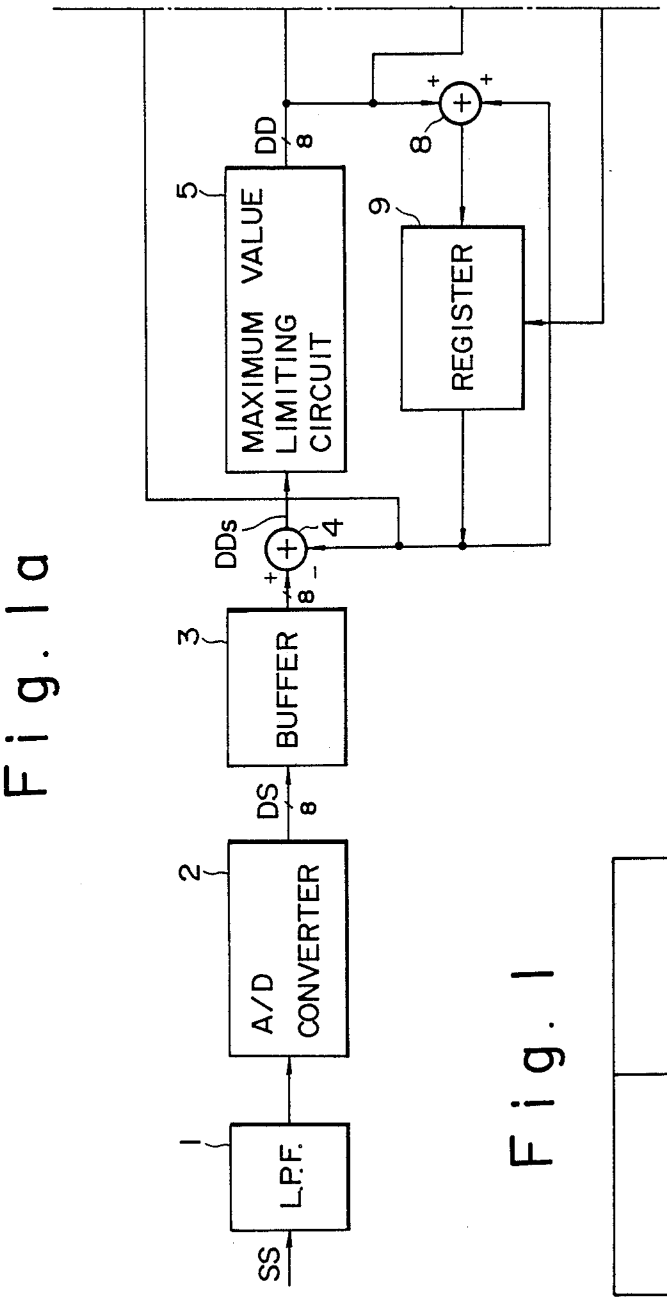
FIGS. 1*a* and 1*b*, when combined as illustrated in FIG. 1, show in block form a voice signal coding system constructed in accordance with one embodiment of the present invention.
Figure 1:
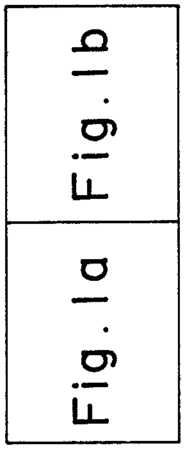
FIG. 1 illustrates how to combine FIGS. 1*a* and 1*b*.
Figure 1B:
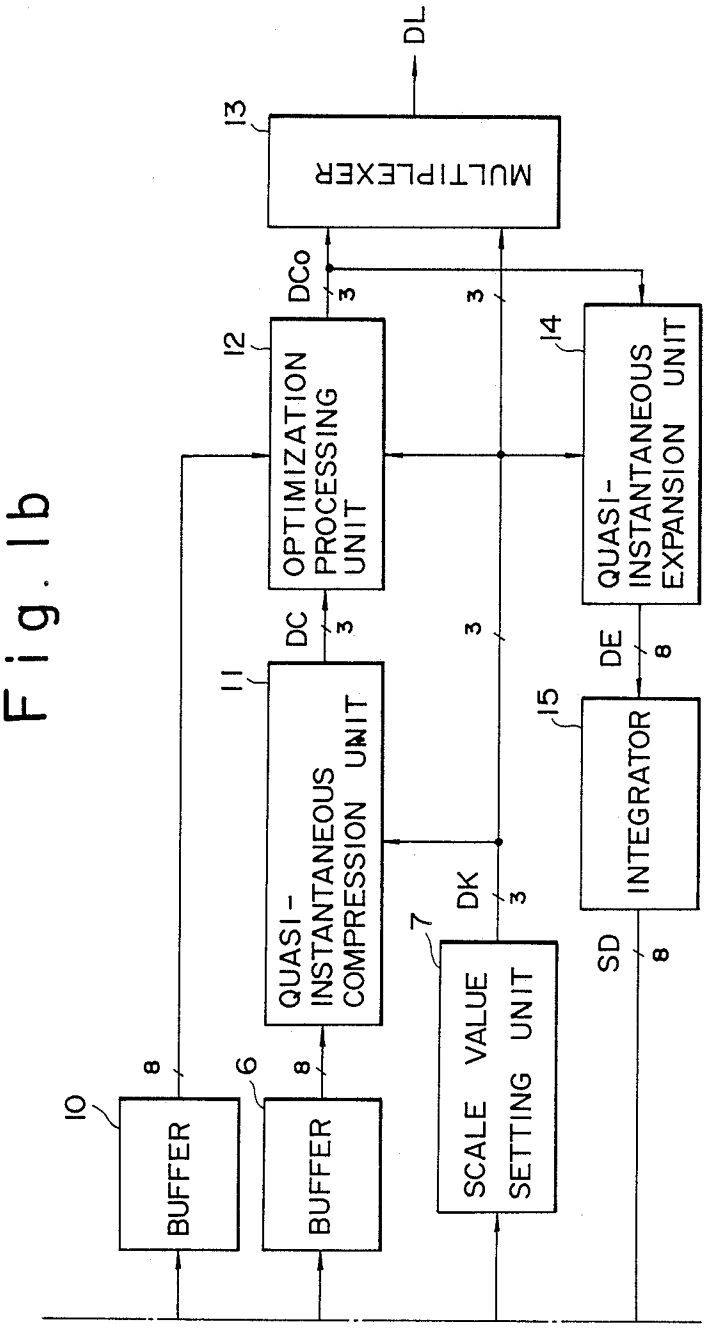

Referring now to FIGS. 1*a* and 1*b*, which are to be combined as illustrated in FIG. 1, there is shown in block form a voice signal coding system constructed in accordance with one embodiment of the present invention. In the illustrated embodiment, it is structured with the application of quasi instantaneous companding to the differential PCM coding method, whereby compression differential data in the form of blocks obtained by application of quasi instantaneous companding are decoded in sequence and compared with the original signal to thereby carry out correction at each sample point so as to provide differential data having a reduced error within the number of compression bits. In addition, in the illustrated embodiment, a voice signal is sampled at the sampling frequency of 8 kHz and a differential value between the samples is indicated by an 8-bit data using the two's complement representation. And, a block for the quasi instantaneous companding step is constructed by eight samples, and the transmission data contains three bits for one sample with the scale data defined by three bits.

In FIGS. 1*a* and 1*b*, an input voice signal SS is limited in band by a low pass filter 1 and then applied to an A/D converter 2 from where an 8-bit digital signal DS is output. The A/D converter 2 has the sampling frequency of 8 kHz and linear quantization characteristic. The digital signal DS is stored into a buffer 3 which has a memory capacity for storing eight samples for defining one block. A digital signal DSd thus stored in the buffer 3 is then supplied to a positive input terminal of an adder/subtractor 4 so as to form a differential data. A 9-bit differential data DDs output from the adder/subtractor 4 is converted into an 8-bit differential data DD by a maximum value limiting circuit 5. The reason for limiting the maximum value of the differential data is as follows. That is, if the differential data DDs were subjected to the quasi instantaneous compression, a large scale value would be set for a block having a sporadically produced large differential data, which would tend to deteriorate the followship of data after the quasi instantaneous compression for other smaller differential data. As a result, a reproduced voice would give an awkward impression when heard. In order to cope with this situation, the maximum value of differential data is limited in this manner so as to provide a reproduced voice as natural as possible.

The differential data DD is supplied to a buffer 6 having a memory capacity for storing eight samples, to a scale value setting unit 7 for setting a scale value for use in the quasi instantaneous compression, and also to one input terminal of an adder 8. An output of the adder 8 is supplied to a register 9 whose output is supplied to a negative input terminal of the adder/subtractor 4, to another input terminal of the adder 8 and also to a buffer 10 having a memory capacity for storing eight samples. In this manner, a cumulative value of the differential data DD which has been limited to eight bits by the maximum value limiting circuit 5 is defined by the adder 8, and this data is used as the data of a sample which is immediately before the current sample for the formation of differential data DDs. The data stored in the buffer 6 is supplied to a quasi instantaneous compression unit 11 where a quasi instantaneous compression coding step is carried out for each sample.

The scale value setting unit 7 identifies the one, which is the largest in maximum value, among the eight samples of differential data DD continuously output from the maximum value limiting circuit 5, determines the MSB bit of its bit pattern, and then outputs its bit position as a 3-bit scale data DK. The scale data DK is then supplied to the quasi instantaneous compression unit 11, to an optimization processing unit 12 for converting the compression differential data DC output from the quasi instantaneous compression unit 11 into an optimized data, to one input terminal of a multiplexer 13 for forming one block of data into a signal of predetermined format, and also to a quasi instantaneous expanding unit 14 for expanding the optimized compression differential data. On the other hand, the data stored in the buffer 10 is a coded data formed by accumulating differential data DD output from the register 9 and it is supplied to the optimization processing unit 12 as the original voice signal which is a subject to be coded.

At the quasi instantaneous compression unit 11, for each sample of an 8-bit differential data DD supplied from the buffer 6, a 3-bit data whose MSB bit corresponds to the bit of the sample pattern which is one bit higher than the scale position represented by the scale data DK supplied from the scale value setting unit 7 is extracted and the thus extracted data is output to the optimization processing unit 12 as a compression differential data DC. At the optimization processing unit 12, a block of compression differential data DC supplied from the quasi instantaneous compression unit 11 is decoded in sequence and the thus decoded data is compared with the original signal supplied from the buffer 10, whereby the compression differential data DC is corrected for each sample point so as to form a differential data having a reduced error within the number of compression bits. And, the thus corrected data is supplied as an optimized differential data $DC_0$ to the remaining input terminal of the multiplexer 13 and also to the quasi instantaneous expansion unit 14.

Figure 2:
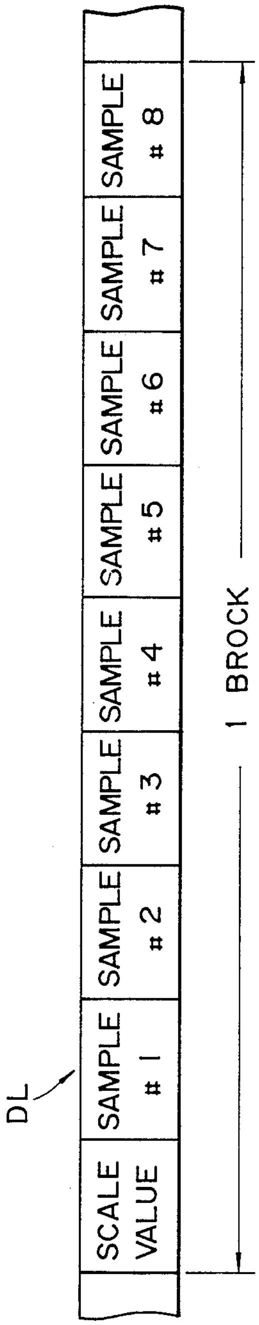
FIG. 2 is an illustration showing an example of a signal format of coded data.

As shown in FIG. 2, at the multiplexer 13, a signal constructed by having the scale data DK output from the scale value setting unit 7 arranged at its beginning or head and having the optimized differential data $DC_0$ of respective samples arranged in sequence subsequent thereto is formed as a coded data DL for one block and output to the next following device, e.g., a data transmission device, a data storing device, or the like. At the quasi instantaneous expansion unit 14, the 3-bit optimized differential data $DC_0$ supplied from the optimization processing unit 12 is arranged such that its MSB bit is located at the bit position which is one bit higher than the bit location indicated by the scale data DK supplied from the scale value setting unit 7, and, in addition, the value of the sign data of the optimized differential data $DC_0$ is assigned to each of the higher bits and "0" is assigned to the lower bits to thereby form an 8-bit decoded data DE, which, in turn, is supplied to an integrator 15.

At the integrator 15, decoded data DE supplied from the quasi instantaneous expansion unit 14 are accumulated and a restored data SD obtaintable by subjecting the coded data DL actually to a decoding processing is formed with the restored data SD being output to the register 9. The register 9 receives this restored data SD after completion of processing for one block and immediately before the initiation of processing for the next following block. With this structure, the accumulation of errors due to a loss of bits, which is inherent to the quasi instantaneous companding process, can be eliminated before the formation of the first sample data of the next block. As a result, the coded data DL can be formed more accurately and more faithfully.

In this manner, in accordance with the illustrated embodiment, at the optimization processing unit 12, the compression differential data DC is corrected such that it follows the time variation of the original voice signal more closely, and, in addition, the cumulative error within one block is reflected in the next following block by the decoded data SD formed at the integrater 15, so that a voice coding processing of low bit rate with the application of the quasi instantaneous companding processing can be implemented at high accuracy.

Figure 3A:
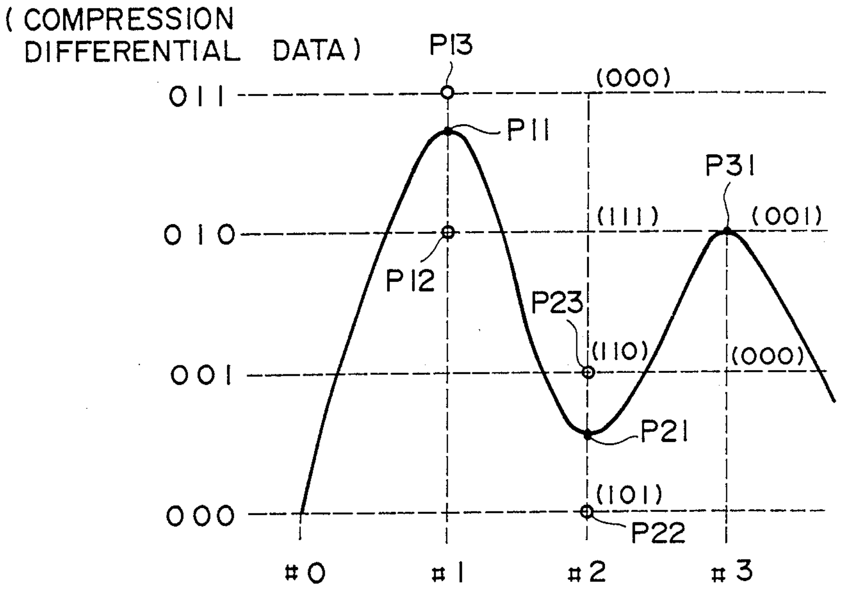
FIG. 3*a* is an illustration which is useful for explaining an optimization processing.

Now, a description will be had below with respect to the optimization processing of compression differential data, which is implemented by the optimization processing unit 12. Let us consider the situation in which a voice waveform illustrated in FIG. 3*a* is to be coded. When differences at sampling points #1, #2 and #3 using sample #0 as a reference are each defined by eight bits, sample #1 will be maximum in absolute value among these differences. Thus, the 3-bit compression differential data in this case are defined using sample #1 as a reference, and the scale value is located at the MSB bit position of this bit pattern. Now, if a compression differential data is represented by three bits, a data which can be represented has a quantization width which is one bit lower in position than the scale value, and, thus, each of samples #1, #2 and #3 is substituted with a data which can be represented within this quantization width. For example, for the compression differential data of sample #1, among those data which can represent this data, value P12 $(=(010)_2)$; however, in this case, LSB is one bit lower in location than the scale position. Likewise hereinafter which is lower than the actual value P11 is substituted. It is to be noted, however, that, among those data which can represent with this quantization width, the data corresponding to value P13 $(=(011)_2)$ which is higher by one unit than P12 will be closer to the actual value P11 of sample #1. Thus, if this value P13 is taken as the compression differential data of sample #1, the error present in the decoded voice signal can be minimized. That is, the error of a decoded value in this case can be limited to $\frac{1}{2}$ of the quantization width of this compression differential data at maximum.

Similarly, regarding samples #2 and #3, it is only necessary to select a compression differential data such that each of their decoded values is as close as possible to the value of the signal before coding, (i.e., value P21 for sample #2 and value P31 for sample #3). That is, in this case, regarding sample #2, since a decoded value based on value P23 which is larger than value P21 as compared with a decoded value based on value P22 which is smaller than value P21 is more closer to value P21, a difference $(=(110)_2)$ between value P11, which is a decoded value of sample #1, and value P23 is set as a compression differential data. In addition, regarding sample #3, since value P31 coincides with a decoded value which can be represented by the compression differential data, a difference $(=(001)_2)$ between value P23, which is a decoded value of sample #2, and value P31 is set as a compression differential data.

Figure 4A:
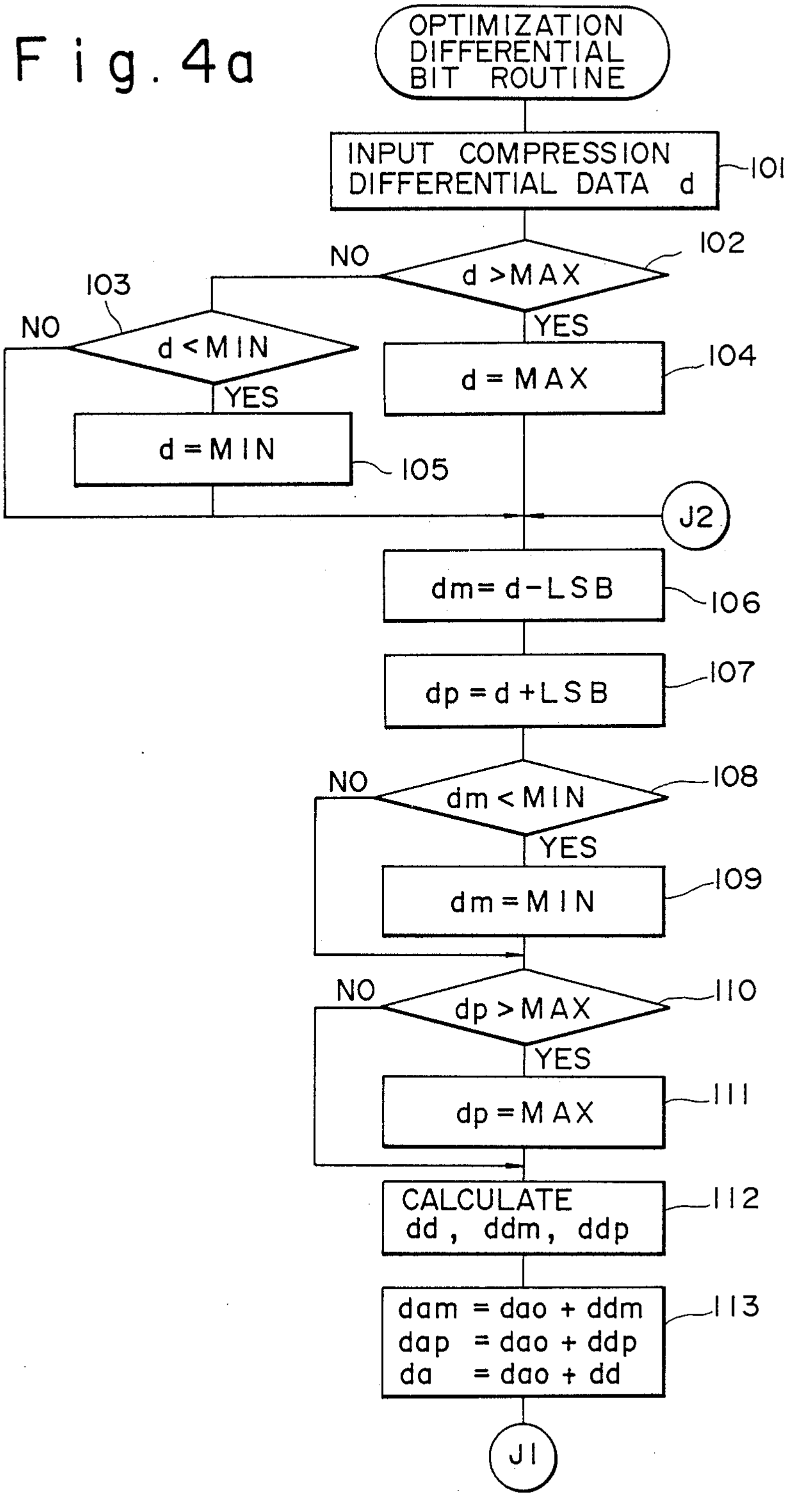
FIGS. 4*a* and 4*b* illustrate a flow chart showing one example of the optimization differential bit routine.
Figure 4B:
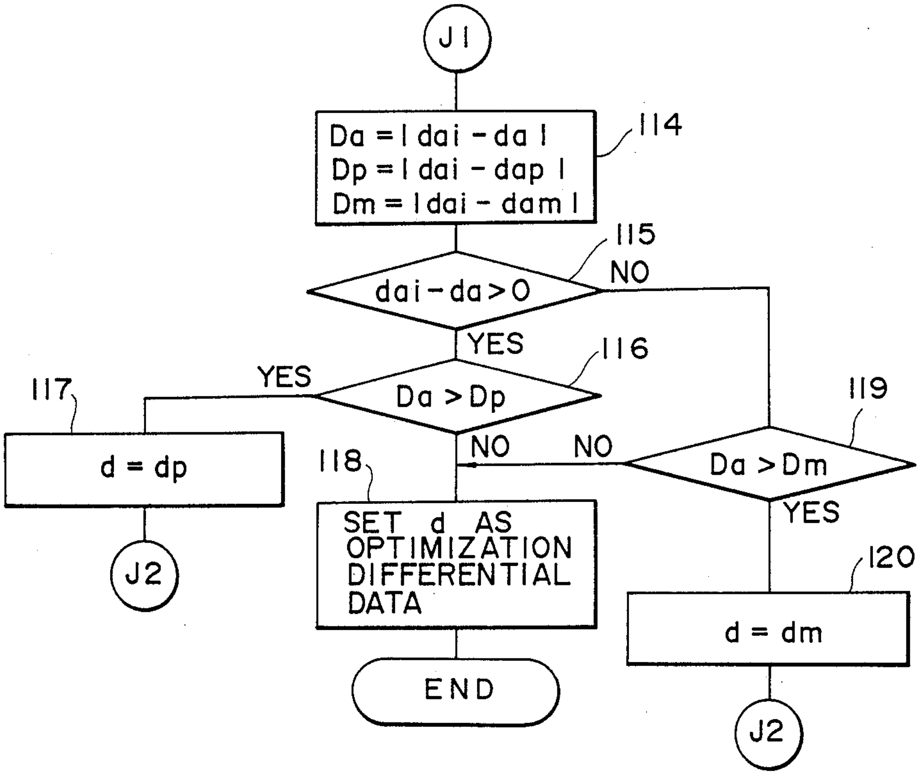

In this manner, there can be formed a compression differential data having an enhanced fidelity and dependence on the original voice signal. One example of the optimization differential bit routine for processing of this procedure is shown in flow chart in FIGS. 4*a* and 4*b*.

In the first place, a compression differential data d (DC) is input from the quasi instantaneous compression unit 11 (step 101), and it is checked whether the value of this compression differential data d is larger than a positive maximum value MAX $(=(011)_2)$ which can be represented by the number of compression bits (in this case, 3 bits) or smaller than a negative maximum value MIN $(=(100)_2)$ (steps 102 and 103). If the result of determination step 102 is YES, then the value MAX is substituted into the compression differential data d (step 104). And, if the result of determination step 103 is YES, then the value MIN is substituted into the compression differential data d (step 105). Then, there are formed a value dm which is smaller than the compression differential data d by LSB $(=(001)_2)$ and a value dp which is larger than the compression differential data d by LSB (steps 106 and 107). And, if the value dm is smaller than the value MIN, the value MIN is substituted into the value dm (steps 108 and 109); whereas, if the value dp is larger than the value MAX, the value MAX is substituted into the value dp (steps 110 and 111).

In this manner, upon determination of values dp and dm, 8-bit values dd, ddp and ddm, which result from subjecting the values d, dp and dm to quasi instantaneous expansion based on the scale data DK are calculated (step 112). And, a decoded value da0 which is a decoded value of the data one sample before is added to each of these values dd, ddp and ddm to thereby define local decoded values da, dap and dam cprresponding to respective values d, dp and dm (step 113). At steps 112 and 113, the local decoding processing is implemented, and, for this reason, the decoded value da0 of the immediately preceding sample is stored. Then, the value dai of the original signal corresponding to the sample is read from the buffer 10, and absolute values Da, Dp and Dm of differences between this value dai of the original signal and each of the local decoded values da, dap and dam, respectively, is calculated (step 114), whereby it is checked whether or not the value dai of the original signal is larger than the local decoded value da (step 115). And, if the result of this determination step 115 is YES, then it proceeds to step 116 to check whether or not the absolute value Da is larger than the absolute value Dp. And, if the result of this determination 116 is YES, then after substituting the value dp into the value d (step 117), it goes back to step 106. And, then, if the result of determination at 116 is NO, then the value d is output as the optimized differential data $DC_0$ (step 118).

Figure 3B:
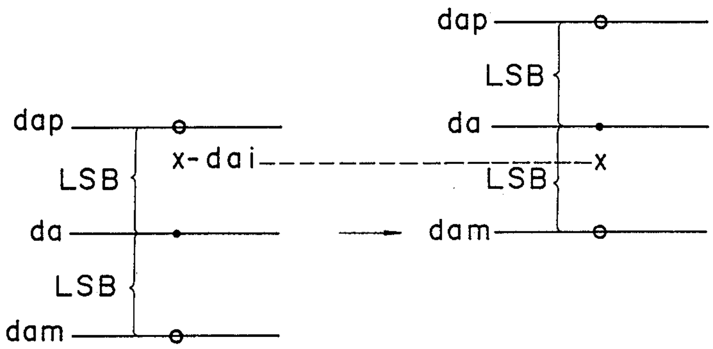
FIG. 3*b* is an illustration which is useful for explaining an optimization differential bit routine.

On the other hand, if the result of determination at step 115 is NO, then it is checked to see whether the absolute value Da is larger than the absolute value Dp (step 119), and if the result of this determination at 119 is YES, then after substituting the value dm into the value d (step 120), it goes back to step 106. And, then, if the result of determination at step 119 is NO, then the process at step 118 is implemented. In other words, as shown at left-hand side of FIG. 3*b*, the value dai of the original signal is closer to the decoded value dap than to the decoded value da, the compression differential data d is modified to the value dp which is larger by LSB, and the thus modified value is output as the optimized differential data $DC_0$. On the contrary, if the value dai of the original signal is closer to the decoded value dam than to the decoded value da, then the compression differential data d is modified to the value dm which is smaller by LSB, and the thus modified value is output as the optimized differential data $DC_0$. If an optimized value has not been obtained by one processing, this processing can be repeated. In this manner, the differential data is corrected so as to reduce an error between a decoded value and the original signal by repetitively carrying out the addition or subtraction operation of LSB of the compression bit to the compression differential data obtained by the quasi instantaneous expansion process for each sample. As the data to be stored in the buffer 10 as the original signal, the output data output from the buffer 3 prior to input into the maximum value limiting circuit 5 may be utilized.

Figure 5A:
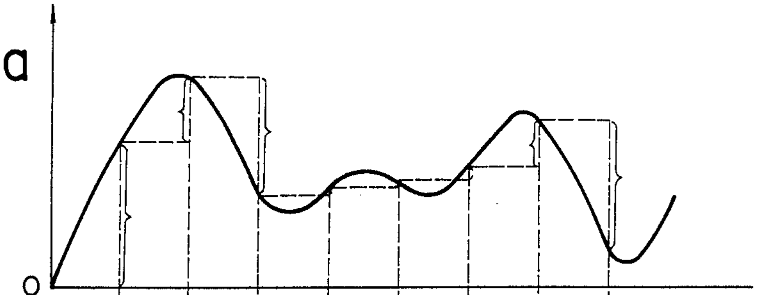
FIGS. 5*a* through 5*c* are illustrations which are useful for understanding the advantages of the optimization processing.
Figure 5B:
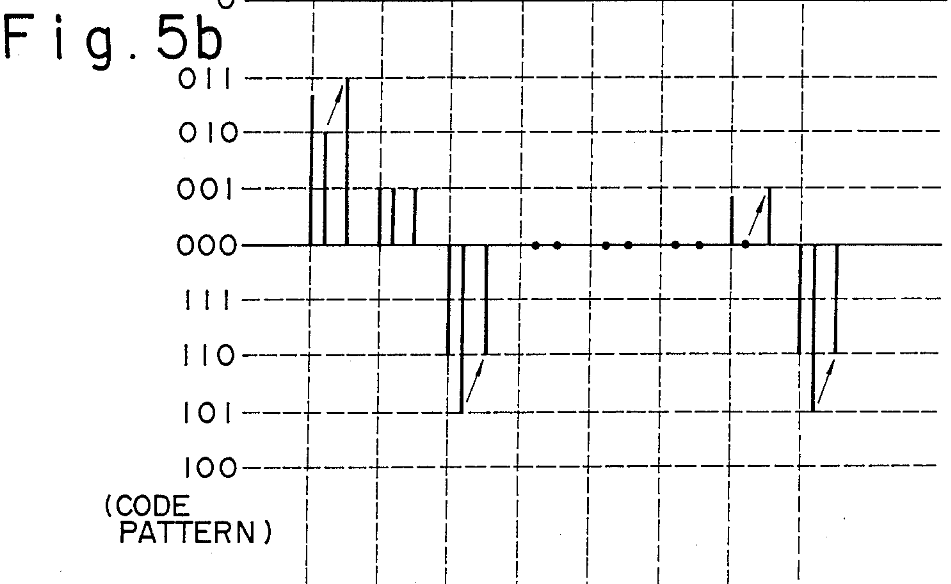
Figure 11A:
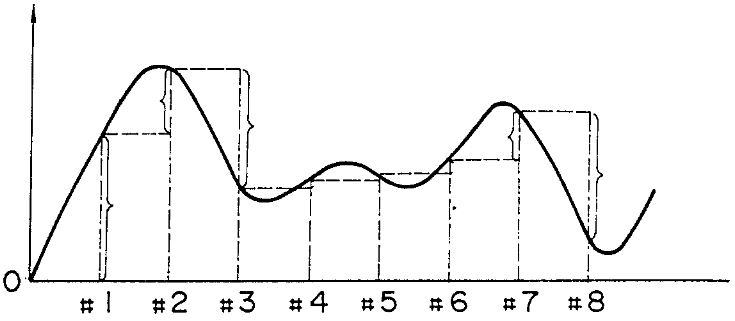
Figure 11B:
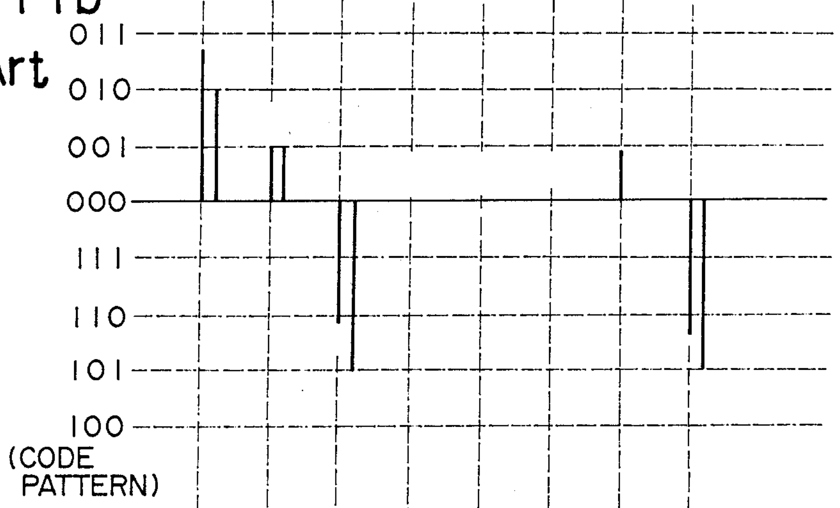
Figure 11C:
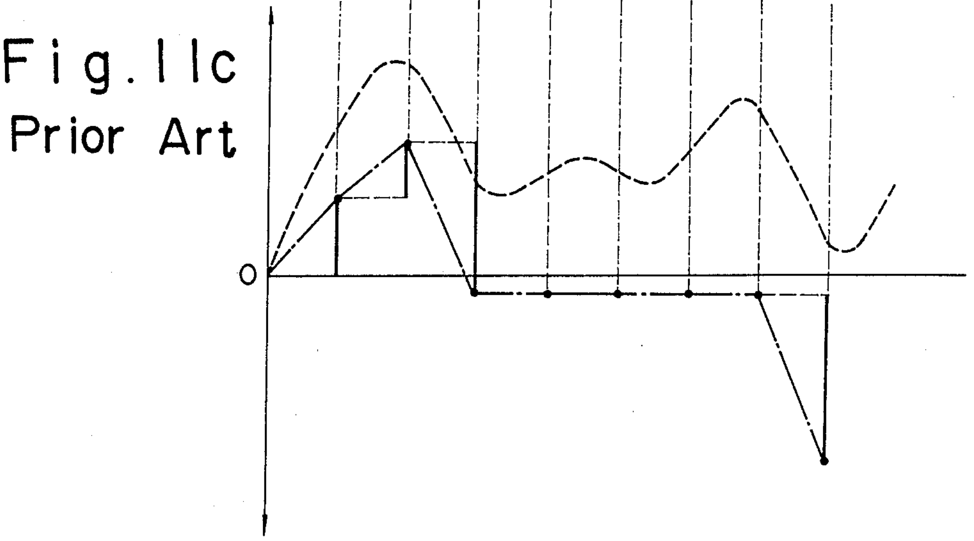

Under this condition, let us consider the case in which a voice signal shown in FIG. 5*a* (identical to the voice signal shown in FIG. 11*a*) is coded by the quasi instantaneous compression processing utilizing the optimization differential bit routine. In the first place, differential values of this voice signal for eight samples #1 through #8 are obtained as shown in FIG. 6*a*, so that the scale position POS is located at bit 4, which corresponds to the MSB position of the bit pattern of sample #1, and, thus, the value of the scale position POS is $(100)_2$. As a result, the compression differential data DC defined by the quasi instantaneous compression unit 11 for each of samples #1 through #8 is as shown in FIG. 6*b*. And, the compression differential data DC is corrected by the above-described optimization differential bit routine to optimization differential data $DC_0$ as shown in FIG. 6*c* each of samples #1 through #8. As a result, in a later-described voice signal decoding system, the value of each of samples #1 through this optimization differential data $DC_0$ is expanded into an 8-bit differential data as shown in FIG. 6*d*, and, then, based on this differential data, a voice signal is decoded as indicated by the solid line in FIG. 5*c*. It is to be noted that in FIG. 5*c* a reproduced voice signal obtained by using the above-described compression differential data DC as a coded data as it is is also shown by the one-dotted line.

Figure 5C:
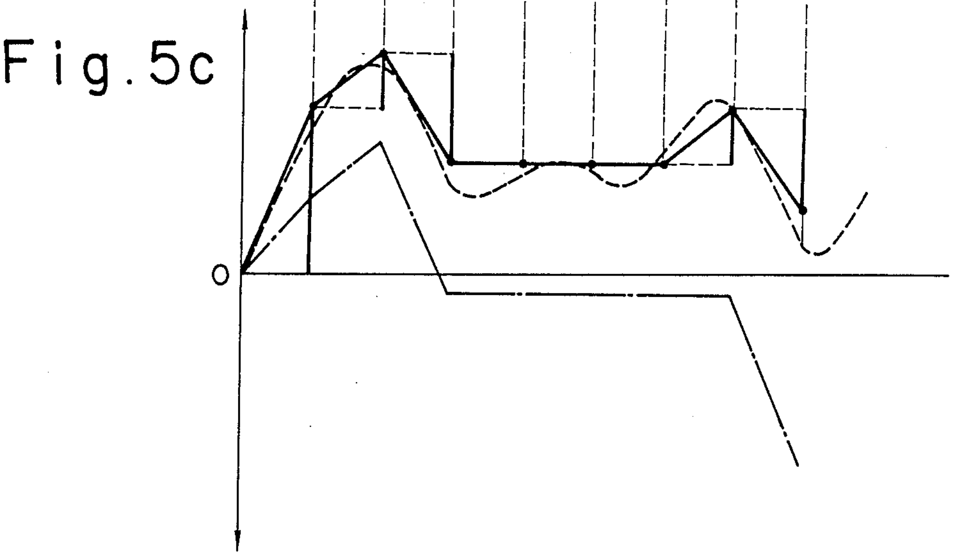

As may be understood from these comparisons, a voice signal reproduced on the basis of the optimization differential data $DC_0$ significantly agrees with the voice signal prior to coding as indicated by the dotted line in FIG. 5*c*, so that there is obtained an enhanced fidelity and followship to the original voice signal prior to coding. It should be noted that, other than the above-described optimization differential bit routine, the optimization processing of a compression differential data as described above can be realized. For example, after determination of the scale value, the compression differential data can be optimized by sequentially selecting one of decoded values which can be obtained with a quantization width corresponding to the scale value which is closest to the sampling value and then defining a compression differential data corresponding to that decoded value.

Figure 7:
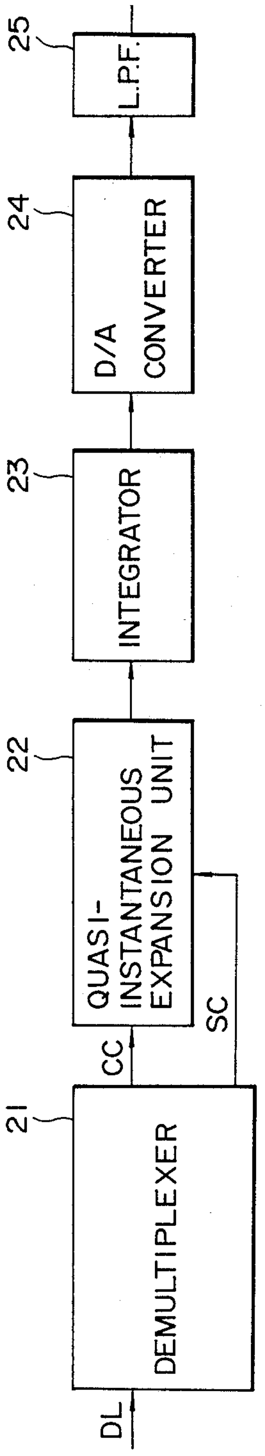
FIG. 7 is a block diagram showing an example of a voice signal decoding apparatus constructed in accordance with one embodiment of the present invention.

FIG. 7 illustrates one example of a voice decoding system constructed in accordance with one embodiment of the present invention. This voice decoding system is so structured to decode the coded data DL which has been coded by the above-described voice coding system and then to output a voice signal thus reproduced. In FIG. 7, a coded data DL output, for example, from the preceding device (not shown), such as a data receiving device, a data storing device or the like, is supplied to a demultiplexer 21, and, for each block, the first three bits are identified as the scale value SC and are supplied to a scale value input terminal of the quasi instantaneous expansion unit 22, and other code data (compression differential data) are supplied to a code data input terminal of the quasi instantaneous expansion unit 22. At the quasi instantaneous expansion unit 22, the code data thus supplied is segmented three bits by three bits and the 3-bit data is arranged at the bit position corresponding to the scale data SC input as an 8-bit data with the contents of the sign bit being assigned in the upper bits higher than the code data and "0" being assigned to the lower bits to thereby expand into an 8-bit data (see FIG. 6*d*), and this 8-bit data is supplied into the integrator 23.

At the integrator 23, sequentially input 8-bit data are cumulatively calculated to thereby define a signal value of a voice signal at each sample, which is then supplied to a D/A converter 24. At the D/A converter 24, a received signal value is converted into a corresponding analog signal (level signal) with a converting frequency of 8 kHz, which is then supplied to a low pass filter 25. After having shaped a waveform by the low pass filter 25, the analog signal is then supplied to the next following device (e.g., a voice outputting device) as a reconstructed voice signal. In this manner, the structure of a voice decoding system for decoding a coded data in accordance with the present invention is significantly simplified. Thus, for example, such a voice decoding system can be realized by using a general-purpose 8-bit microprocessor and the cost can be maintained extremely low.

Now, in the quasi instantaneous companding processing, the scale position is so set on the basis of a bit pattern having a maximum signal value in absolute value within one block. Thus, for example, if there is a sample having a sporadically large value in the block, a scale value corresponding to such a large value is set, so that the dependency or followship of coded data to other smaller values tend to be poor, which can be a cause of disadvantage in the listening characteristic. Under the circumstances, another aspect of the present invention provides an embodiment capable of obviating such a disadvantage as will be described in detail below. In order to attain this objective, it is only necessary to define a coded data which is least in error in a block, and, for this purpose, it is only necessary to set the scale position (value) appropriately.

In accordance with an embodiment of this aspect of the present invention, an error is calculated between the value of the voice signal prior to coding and a decoded value in each sample (1) when the quasi instantaneous compression is carried out on the basis of the initially set scale position, (2) when the quasi instantaneous compression is carried out based on the scale position which is set at a location one bit higher than the initially set scale position, (3) when the quasi instantaneous compression is carried out based on the scale position which is set at a location one bit lower than the initially set scale position. And, then, based on the thus calculated errors, an evaluation value is determined for each of the scale positions, and, then, based on these evaluation values, the most excellent one among these scale positions is selected. As the evaluation value, use may be made of a grand total of differences in absolute value between the original voice signal and a decoded value in each sample or a grand total (error power) of squares of such differences.

Figure 8A:
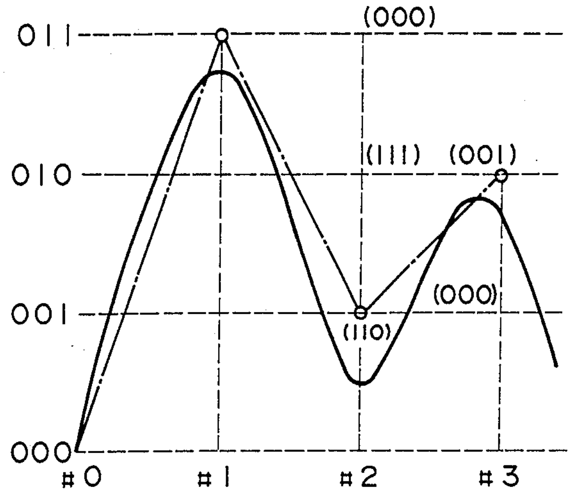
FIGS. 8*a* through 8*c* are illustrations which are useful for understanding another embodiment of the present invention.
Figure 8B:
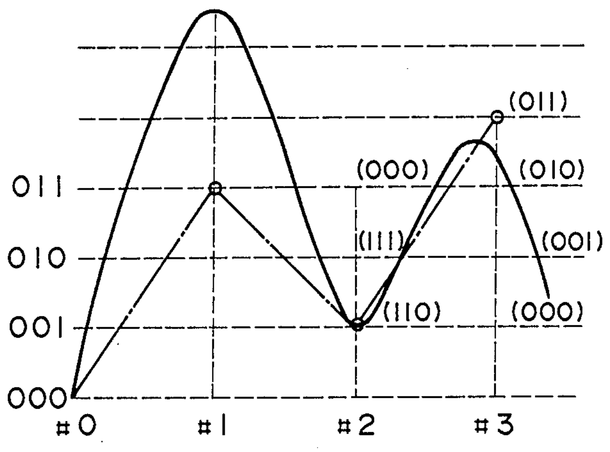
Figure 8C:
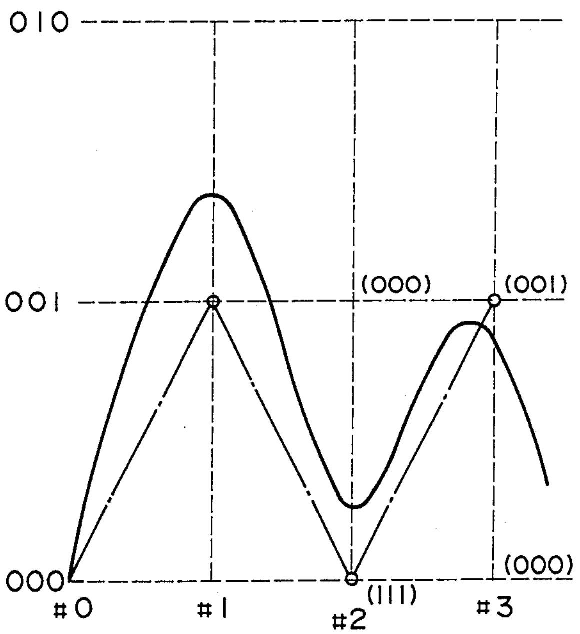

That is, for example, in the case of a voice signal shown in FIG. 8*a*, the scale value is determined on the basis of sample #1 whose differential value is the largest among the three samples #1 through #3 of this voice signal. On the other hand, if the scale value is made smaller by one unit, the quantization width of a sample value becomes smaller one step, so that there is obtained a condition shown in FIG. 8*b*. On the other hand, if the scale value is made one step larger, the quantization width of a sample value is made one step larger, thereby producing a condition shown in FIG. 8*c*. When the above-described optimization processing using the optimization differential bit routine is carried out in each of these conditions, the sign bit in each sample is as tabulated below.

TABLE

| SCALE VALUE | SAMPLE #1 | #2 | #3 |
|---|---|---|---|
| $SC_0$ | 001 | 110 | 011 |
| $SC_{-1}$ | 011 | 110 | 011 |
| $SC_1$ | 001 | 111 | 001 |

Here, $SC_0$: scale value for the case of FIG. 8a;
$SC_{-1}$: scale value for the case of FIG. 8b which is smaller than $SC_0$ by 1;
$SC_1$: scale value for the case of FIG. 8c which is larger than $SC_0$ by 1.

In this manner, when the scale value is varied, as a matter of course, the grand total or error power of differences between the original voice signal and decoded values becomes a minimum for any one of the scale values corresponding to changes of the original signal in a block, and the scale value having such a minimum is most excellent in dependency or followship to the voice signal in the corresponding block. For example, according to the experiments conducted by the inventors, statistically speaking, the frequency of occurrence of minimization of error powers for the scale value $SC_0$ is approximately 60% of the total number of blocks and similarly approximately 30% for the scale value $SC_{-1}$ and approximately 10% for the scale value $SC_1$. In this manner, the quality of a reproduced voice signal is enhanced (in listening characteristic) by appropriately selecting the scale value to be used for each block.

Figures 9, 9A:
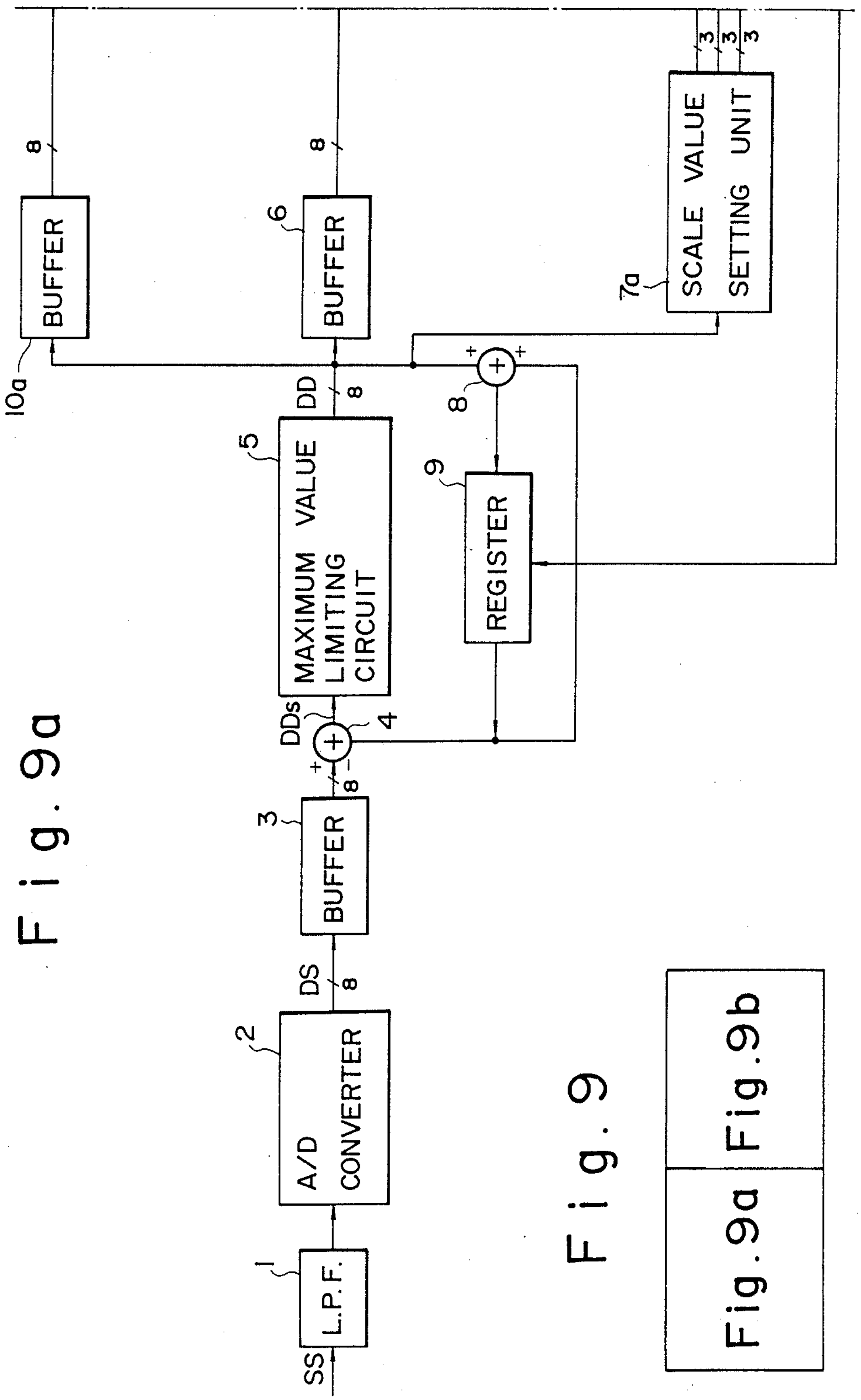
FIG. 9 illustrates how to combine FIGS. 9*a* and 9*b*.
FIGS. 9*a* and 9*b*, when combined as illustrated in FIG. 9, show in block form a voice signal coding system constructed in accordance with another embodiment of the present invention.
Figure 9B:
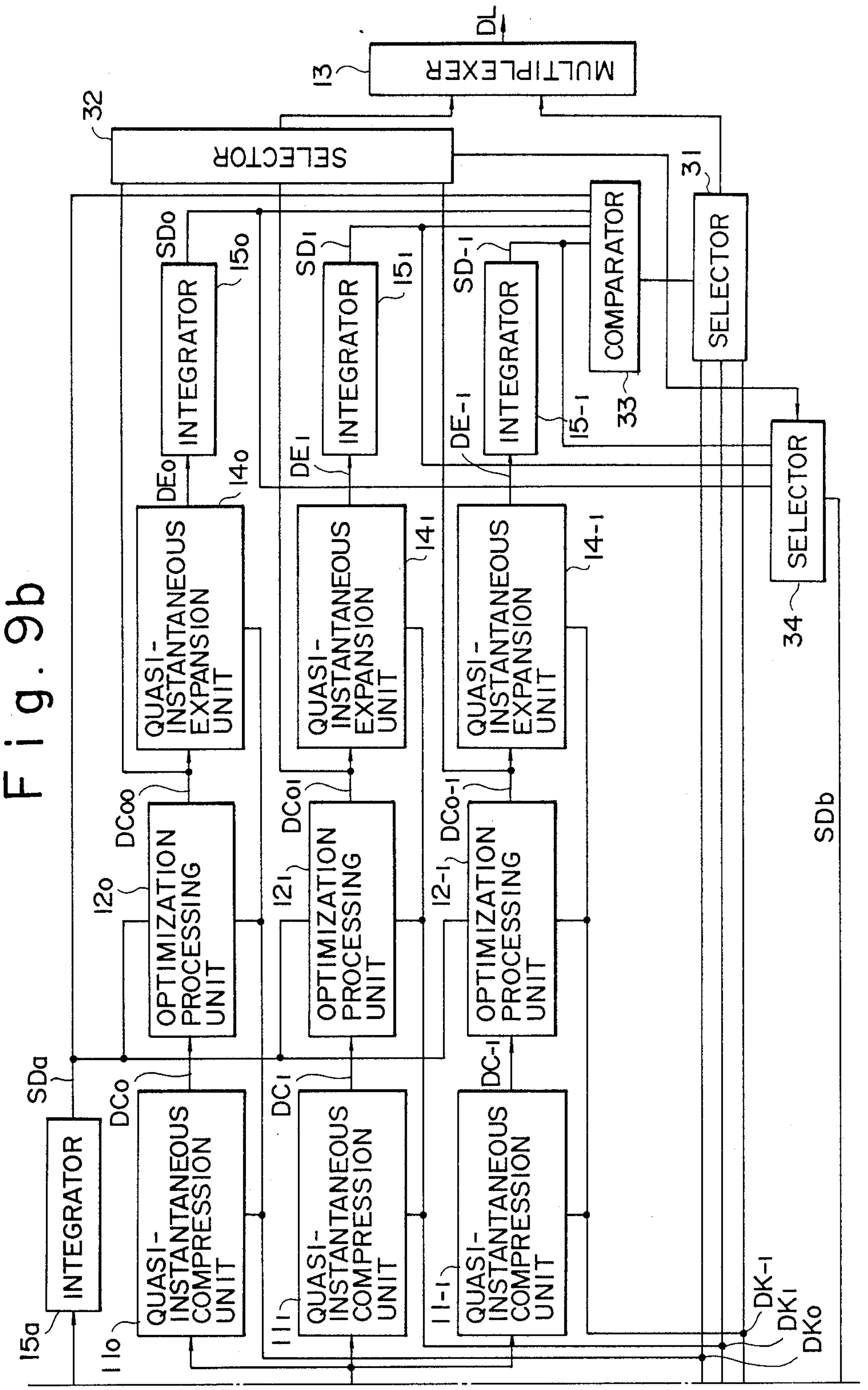

One example of a voice coding system constructed in accordance with this embodiment is illustrated in FIGS. 9*a* and 9*b*. It is to be noted that the system shown in FIGS. 9*a* and 9*b* is similar in many respects to the system shown in FIGS. 1*a* and 1*b*, so that like elements are indicated by like numerals. It should also be noted that this system operates the quasi instantaneous compression for one block as a unit. As shown in FIGS. 9*a* and 9*b*, a scale value setting unit 7*a* determines the scale value by a block comprised of continuous eight samples of the differential data DD output from the maximum value limiting circuit 5 and defines a value which is larger than the scale value by 1 and another value which is smaller than the scale value, thereby outputting as scale data $DK_0$, $DK_1$ and $DK_{-1}$. These scale data $DK_0$, $DK_1$ and $DK_{-1}$ correspond to the above-described scale values $SC_0$, $SC_1$ and $SC_{-1}$, respectively. The scale data $DK_0$ is supplied to the quasi instantaneous compression unit $\mathbf{11}_0$, optimization processing unit $\mathbf{12}_0$, quasi instantaneous expansion unit $\mathbf{14}_0$ and one input terminal of a selector 31. The scale data $DK_1$ is supplied to the quasi instantaneous compression unit $\mathbf{11}_1$, optimization processing unit $\mathbf{12}_1$, quasi instantaneous expansion unit $\mathbf{14}_1$ and also to another input terminal of the selector 31. The scale data $DK_{-1}$ is supplied to the quasi instantaneous compression unit $\mathbf{11}_{-1}$, optimization processing unit $\mathbf{12}_{-1}$, quasi instantaneous expansion unit $\mathbf{14}_{-1}$ and also to the remaining input terminal of the selector 31.

Based on the scale data $DK_0$. the quasi instantaneous compression unit $\mathbf{11}_0$ defines a compression differential data $DC_1$ from an output data of the buffer 6. At the optimization processing unit $\mathbf{12}_0$, the above-described optimization differential bit routine is applied to the compression differential data $DC_0$ to thereby define an optimization differential data $DC_{00}$ which is then supplied to the quasi instantaneous expansion unit $\mathbf{14}_0$ and also to one input terminal of a selector 32. At the quasi instantaneous expansion unit $\mathbf{14}_0$, the optimization differential data $DC_{00}$ is expanded into an 8-bit data $DE_0$ on the basis of the scale data $DK_0$. and this data $DE_0$ is cumulatively calculated at the integrator $\mathbf{15}_0$ to be decoded so that the resulting decoded value $SD_0$ is supplied to one input terminal of a comparator 33 and also to one input terminal of a selector 34.

At the quasi instantaneous compression unit $\mathbf{11}_1$, a compression differential data $DC_1$ is defined from an output data from the buffer 6 on the basis of the scale data $DK_1$. And, at the optimization processing unit $\mathbf{12}_1$, the above-described optimization differential bit rountin is applied to the compression differential data $DC_1$ to thereby define an optimization differential data $DC_{01}$ which is then supplied to the quasi instantaneous expansion unit $\mathbf{14}_1$ and also to another input terminal of the selector 32. At the quasi instantaneous expansion unit $\mathbf{14}_1$, the optimization differential data $DC_{01}$ thus input is expanded into an 8-bit data $DE_1$ on the basis of the scale data $DK_1$ which, in turn, is cumulatively calculated at the integrator $\mathbf{15}_1$ and thus decoded. And, the resulting decoded value $SD_1$ is supplied to one input terminal of the comparator 33 and also to one input terminal of a selector 34.

Similarly, at the quasi instantaneous compression unit $\mathbf{11}_{-1}$, a compression differential data $DC_{-1}$ is defined from an output data from the buffer 6 on the basis of the scale data $DK_{-1}$. At the optimization processing unit $\mathbf{12}_{-1}$, the above-described optimization differential bit routine is applied to the compression differential data $DC_{-1}$ to thereby define an optimized differential data $DC_{0-1}$ which is then supplied to the quasi instantaneous extension unit $\mathbf{14}_{-1}$ and also to one input terminal of the selector 32. At the quasi instantaneous expansion unit $\mathbf{14}_{-1}$, the optimized differential data $DC_{0-1}$ thus input is expanded into an 8-bit data $DE_{-1}$ on the basis of the scale data $DK_{-1}$ which is then cumulatively calculated at the integrator $15_{-1}$ and thus decoded. And, the resulting decoded value $SD_{-1}$ is supplied to one input terminal of the comparator 33 and also to one input terminal of the selector 34.

On the other hand, a differential data DD output from the maximum value limiting circuit 5 is stored by the amount of one block in the buffer 10a, an output of which is cumulatively calculated in sequence by the integrator 15a to thereby define a non-compressed voice signal (i.e., original voice signal), and the data SDa corresponding thereto is supplied to the optimization processing units $12_0$, $12_1$, $12_{-1}$ and comparator 33. In this manner, to the comparator 33 is supplied, for each sample, a data SDa corresponding to the original signal, a decoded value $SD_0$ obtained by decoding the optimized differential data $DC_{00}$ corresponding to the scale value $SC_0$ (scale data $DK_0$), and also a decoded data $SD_{-1}$ obtained by decoding the optimized differential data $DC_{0-1}$ corresponding to the scale value $SC_{-1}$ (scale data $DK_{-1}$). At the comparator 33, based on the data SDa and coded values $SD_0$, $SD_1$ and $SD_{-1}$, errors from the data SDa from the respective decoded values $SD_0$, $SD_1$ and $SD_{-1}$ are defined for each sample, and the error power in one block is calculated for each of the decoded values $SD_0$, $SD_1$ and $SD_{-1}$, and the one having a minimum value among those is determined.

And, if the error power for the decoded value $SD_0$ is a minimum, then the scale data $DK_0$ is selected by the selector 31 and then supplied to the multiplexer 13, and, at the same time, the optimized differential data $DC_{00}$ is selected by the selector 32 and then supplied to the multiplexer 13. In addition, the sign value $SD_0$ is selected by the selector 34 and is set as a data to be stored into the register 9. On the other hand, if the error power is a minimum for the decoded value $SD_1$, the scale data $DK_1$ is selected by the selector 31 and then supplied to the multiplexer 13, and, at the same time, the optimized differential data $DC_{01}$ is selected by the selector 32 and then supplied to the multiplexer 13. In addition, the sign value $SD_1$ is also selected by the selector 34 and is set as a data to be stored into the register 9. Similarly, if the error power for the decoded value $SD_{-1}$ is a minimum, then the scale data $DK_{-1}$ is selected by the selector 31 and then supplied to the multiplexer 13, and, at the same time, the optimized differential data $DC_{0-1}$ is selected by the selector 31 and then supplied to the multiplexer 13. In addition, the sign value $SD_{-1}$ is selected by the selector 34 and is set as a data to be stored into the register 9.

Figure 10:
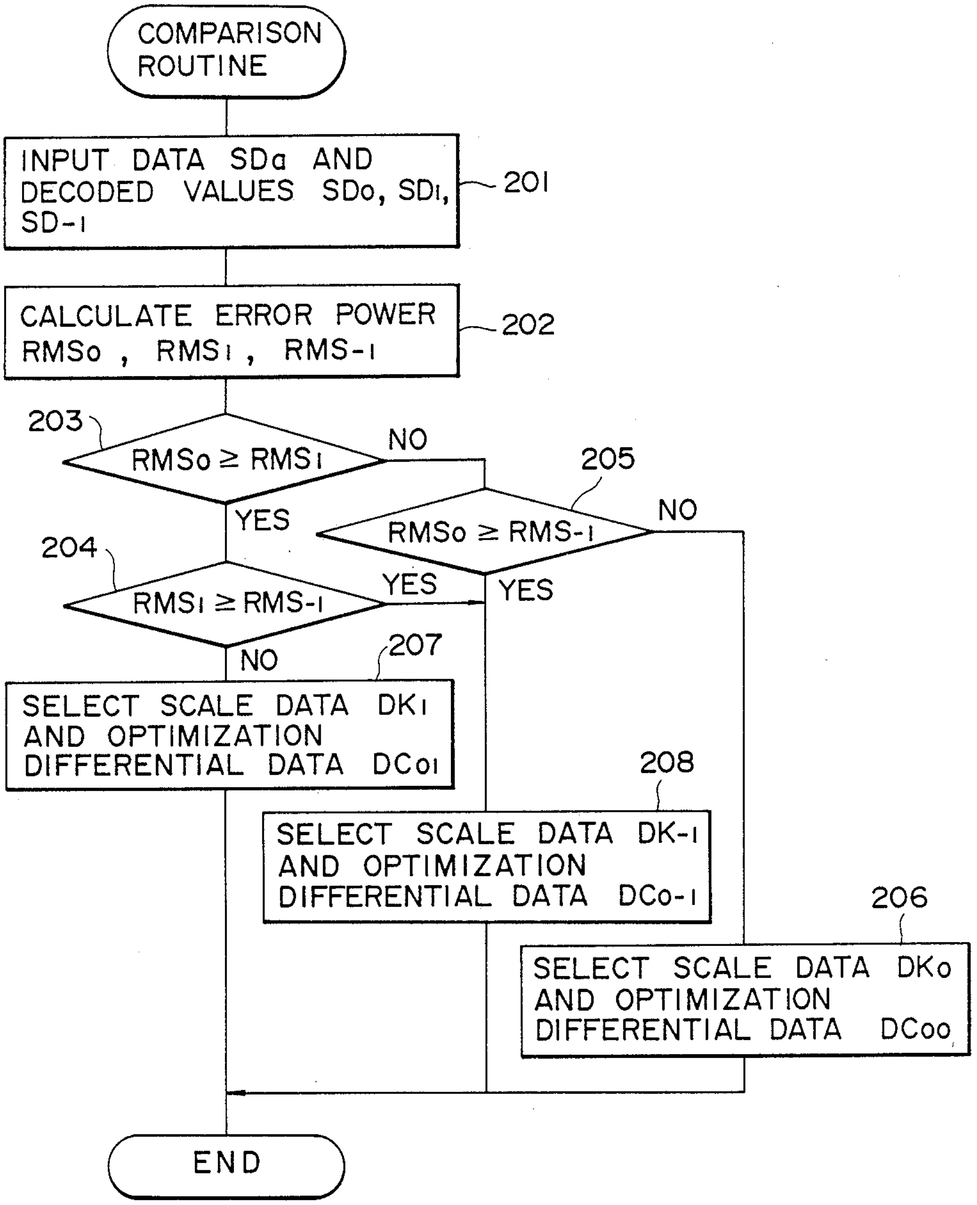
FIG 10 is a flow chart showing one example of a sequence of steps of a comparison routine.

Accordingly, from the multiplexer 13 is output a coded data DL which is a minimum in error power in the corresponding block. FIG. 10 illustrates a flow chart showing one example of a comparison routine to be implemented by the comparator 33. In the first place, data SDa and decoded values $SD_0$, $SD_1$ and $SD_{-1}$ are input sample by sample (step 201), and, then, based on the data thus input, calculations are carried out using the following equation to thereby determine error power $RMS_0$, $RMS_1$ and $RMS_{-1}$ corresponding to decoded values $SD_0$, $SD_1$ and $SD_{-1}$, respectively (step 202).

$$RMS_k = \left( \sum_{j=1}^{n} (SDaj - SDkj)^2 \right)^{\frac{1}{2}}$$

Here, k=0, 1, −1;

j: sample number in a block;

SDaj: data in respective samples in a block;

SDkj: sign values SDk in respective samples in a block.

And, it is determined which of the error powers $RMS_0$, $RMS_1$ and $RMS_{-1}$ is the smallest (steps 203, 204 and 205), and scale data $DK_0$. $DK_1$ and $DK_{-1}$ and optimized differential data $DC_{00}$, $DC_{01}$ and $DC_{0-1}$ are selected respectively corresponding to a minimum error power $RMS_0$, $RMS_1$ and $RMS_{-1}$ (steps 206, 207 and 208).

Incidentally, in this comparison routine, as an evaluation value based on an error between each of decoded values $SD_0$, $SD_1$ and $SD_{-1}$ and data SDa, in addition to the above-described error power, use may, for example, be made of a grand total of differences between data SDa and decoded values $SD_0$, $SD_1$ and $SD_{-1}$ in each sample, or the like. In addition, as a voice decoding system for decoding the coded data DL formed in accordance with this embodiment, use may be made of the system shown in FIG. 7.

In the above-described embodiments, it has been described as to the case in which the quasi instantaneous companding processing is applied to the differential PCM coding method; however, the present invention may also be applied to the case in which the quasi instantaneous companding processing is applied to the PCM coding method. It should also be noted that various constants mentioned in each of the above-described embodiments are illustrative purpose only and the present invention should not be limited only to those described specifically. As described above, in accordance with one aspect of the present invention, since compression data is corrected such that it comes closest to the original voice signal at the time of quasi instantaneous compression processing, a voice of high quality can be reproduced at a low bit rate and with a simple process.

Figures 13, 13A:
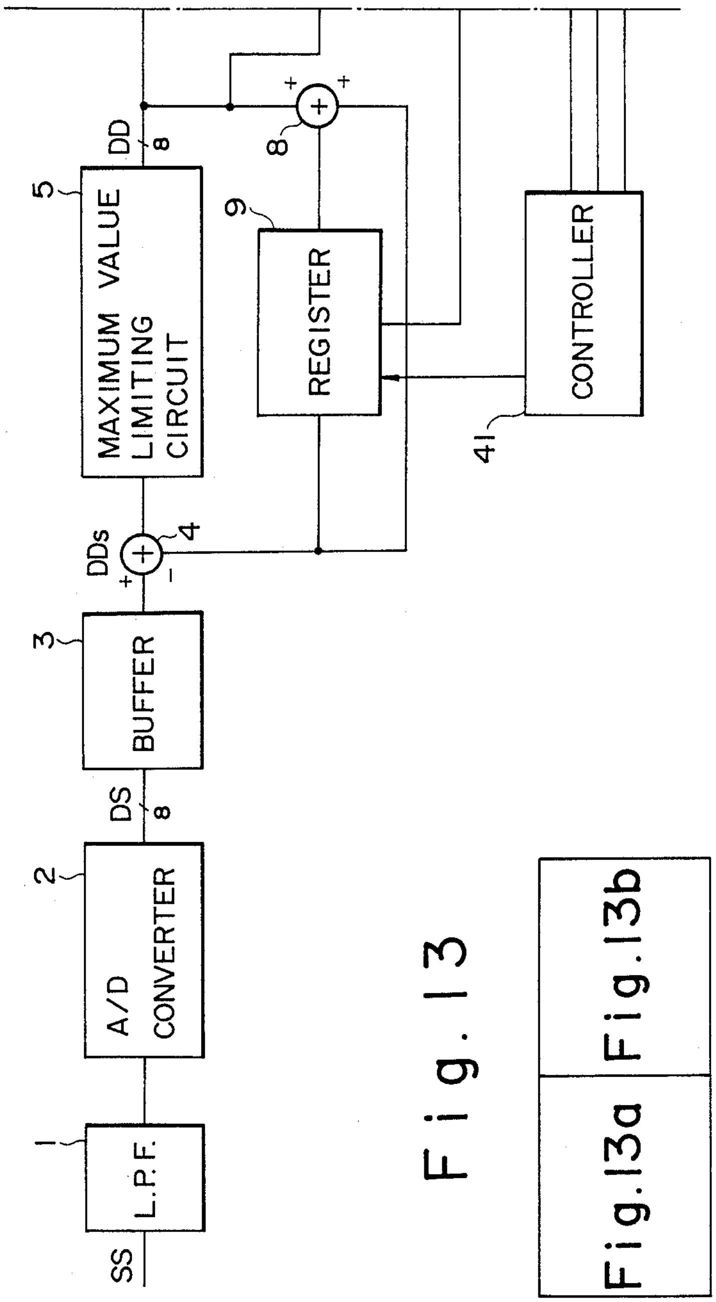
FIG. 13 illustrates how to combine FIGS. 13*a* and 13*b*.
FIGS. 13*a* and 13*b*, when combined as illustrated in FIG. 13, show in block form a voice signal compression coding system constructed in accordance with a further embodiment of the present invention.
Figure 13B:
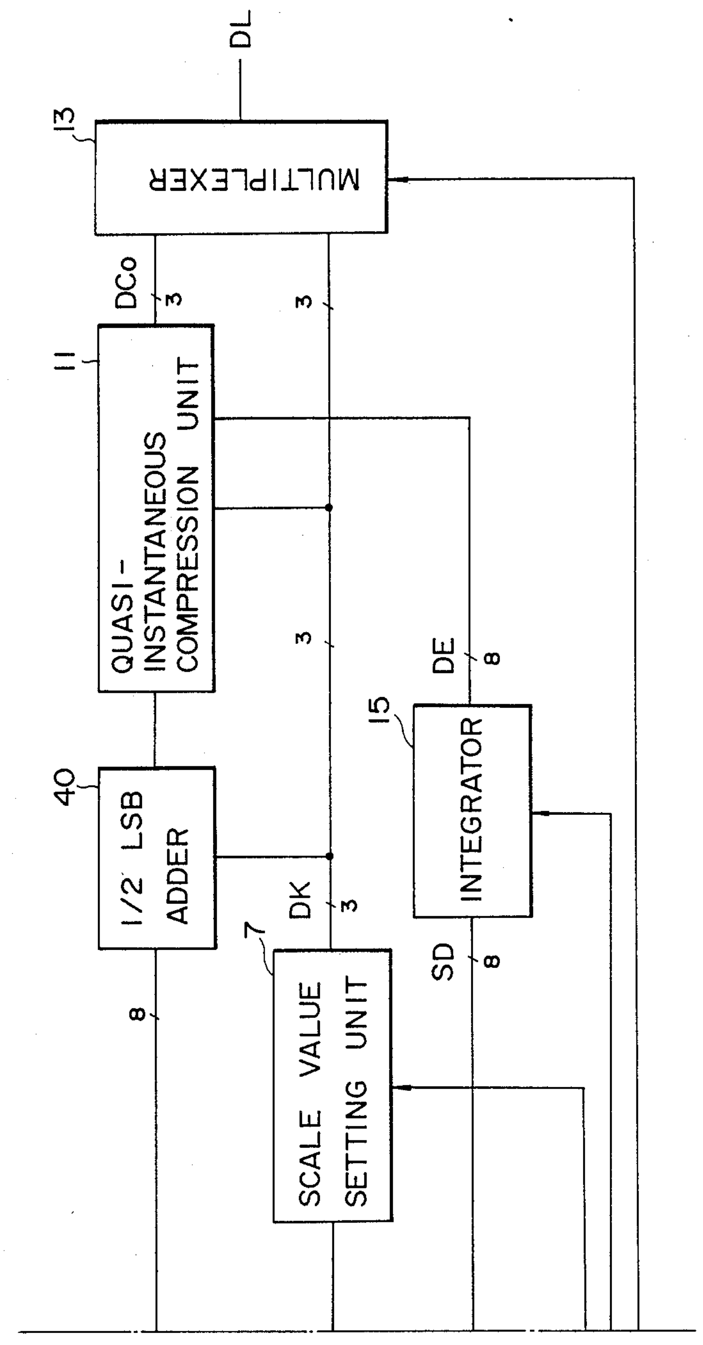

Now, another aspect of the present invention will be described in detail below. In accordance with this aspect of the present invention, there is provided a high-speed voice signal compression coding method and system which is an improvement over the above-described embodiments. A voice signal coding system constructed in accordance with one embodiment of the present invention is illustrated in FIGS. 13a and 13b and it is structurally similar to the embodiment shown in FIGS. 1a and 1b. The present system shown in FIGS. 13a and 13b has been constructed mainly by modifying those elements including the quasi instantaneous compression unit 11, optimization processing unit 12 and quasi instantaneous expansion unit 14 of the structure shown in FIGS. 1a and 1b. As described previously, FIG. 2 shows an example in which one block includes eight samples and FIG. 3a shows an associated voice waveform. In this case, since data P11 of sample #1 is closer to P13 as compared with P12, P13 is selected. This determination is made based on the fact whether point P11 is located at the side of point P11 or at the side of point P13 with respect to a mid-point between points P12 and P13. This indicates the fact that a sign data can be obtained without providing a determination unit if the quasi instantaneous compression is carried out by adding ½ of the minimum value (hereinafter, also referred to as LSB) of the quantization width to P11. The procedure of this calculation (A/D conversion being carried out with eight bits and compression being carried out to three bits) is illustrated in FIGS. 20a through 20g. FIG. 20a illustrates a block of data after subjecting a voice data to A/D conversion, and FIG. 20b illustrates differences of the data shown in FIG. 20a. It is assumed here that the data prior to sample #1 is "0." In this case, the maximum of an absolute value of each data in this block is #1, and the scale value is $b_4$. In FIG. 20b, the scale value is indicated by "POS." FIG. 20c shows differences between the voice data and local decoded values shown in FIG. 20g and obtained by coding and decoding the preceding data. It is assumed that the data before #1 in FIG. 20g is "0." FIG. 20d shows the data which are obtained by adding ½ of LSB (since $b_4$ is the scale value, LSB becomes $b_3$, and, thus, ½ of LSB is 00000100) to the data shown in FIG. 20c, and FIG. 20e shows the data after implementation of the quasi instantaneous compression. And, FIG. 20f shows decoded data on the basis of FIG. 20e, and decoded voice data obtained by integrating the data of FIG. 20f is shown in FIG. 20g.

FIGS. 13a and 13b illustrate a voice signal coding system constructed in accordance with one embodiment of the present invention. The present embodiment is similar to the embodiment shown in FIGS. 1a and 1b, so that like elements are indicated by like numerals. In the present embodiment, a voice waveform SS is passed through a low pass filter 1 where the voice signal is compressed in band to ½ or less of the sampling frequency and is supplied to an A/D converter 2 to be quantized by A/D conversion. An A/D converted data DS is supplied to a buffer 3. One block of data is supplied from the buffer 3 to a maximum value limiting circuit 5 to thereby produce differences and the data is supplied to a scale value setting unit 7. At the scale value setting unit 7, an absolute value of each of the differential data is calculated, and a maximum of such an absolute value is determined. Then, based on such a maximum, an effective MSB or scale value is determined. Then, differences between the data stored in the buffer 3 and the data which has been locally decoded by an integrator 15 are determined, and the data is transferred to a ½ LSB adder 40 where the value of ½ of LSB of the transmission bits is added based on the scale value. However, if the scale value is exceeded by addition, the transmittable maximum value is adopted. The ½ LSB added data is then supplied to the quasi instantaneous compression unit 11, where the data produced by discarding the lower bits is supplied to the integrator 15 for local decoding and the data to be transmitted is supplied to a multiplexer. At the multiplexer 13, the scale value and the data are output as a unit.

Also provided in the system shown in FIGS. 13a and 13b is a controller 41 which switches between the operation for determining the scale value and the operation for implementing coding. In the case where the scale value is to be determined, the output operation of the integrator 15 and the multiplexer 13 is halted with the input of the register 9 switched to the adder and the operation of the scale value setting unit 7 being rendered active. On the other hand, in the case where the coding operation is to be carried out, the output operation of the integrator 15 and the multiplexer 13 is rendered active with the input of the register 9 being switched to the output of the integrator 15 and the operation of the scale setting unit 7 being halted to thereby maintain the output of the scale value. In addition, at the end of one block, the locally decoded data is supplied to the register for taking a difference of the scale value setting unit.

Figure 14A:
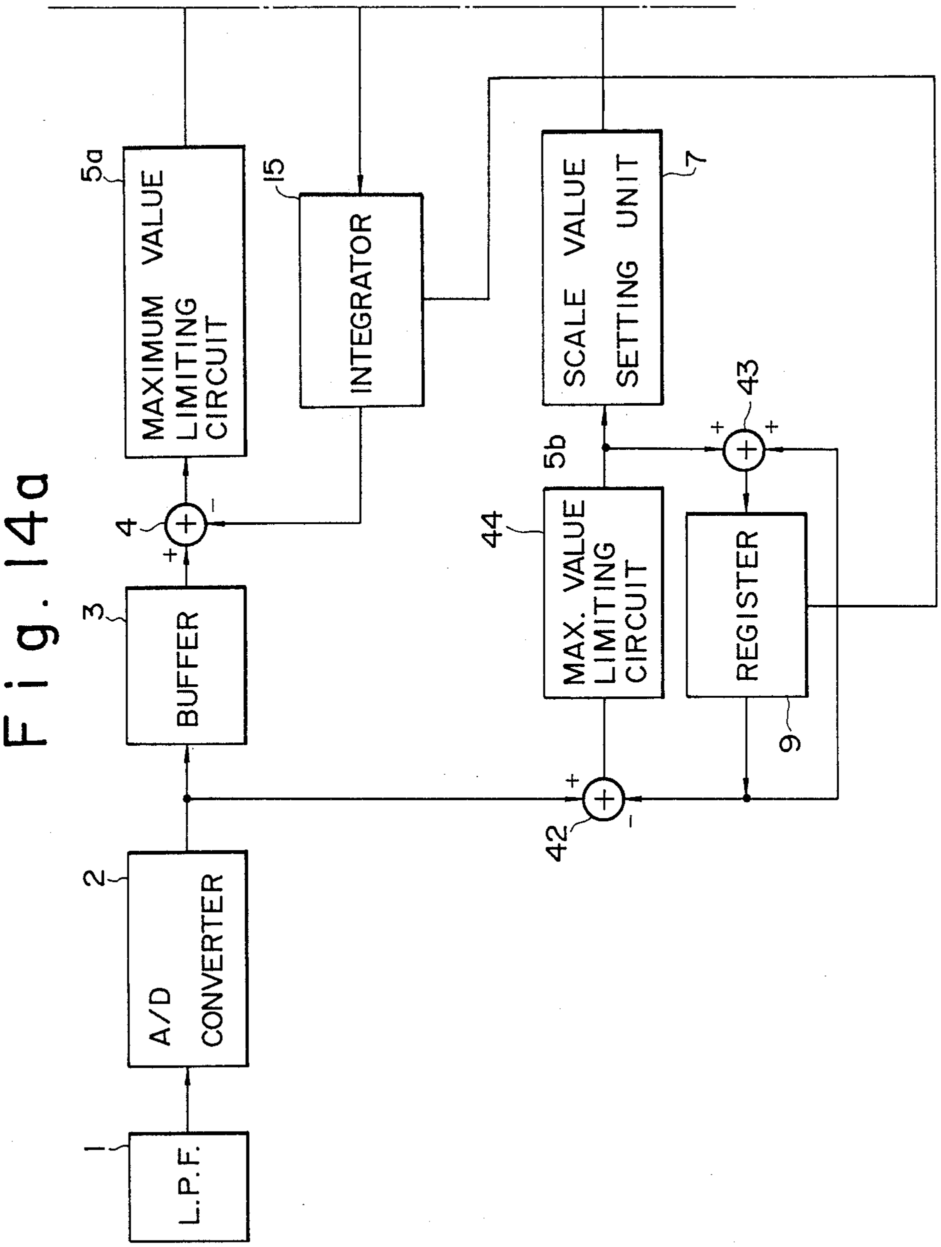
FIGS. 14*a* and 14*b*, when combined as illustrated in FIG. 14, show in block form a voice signal compression coding system constructed in accordance with a still further embodiment of the present invention.
Figure 14B:
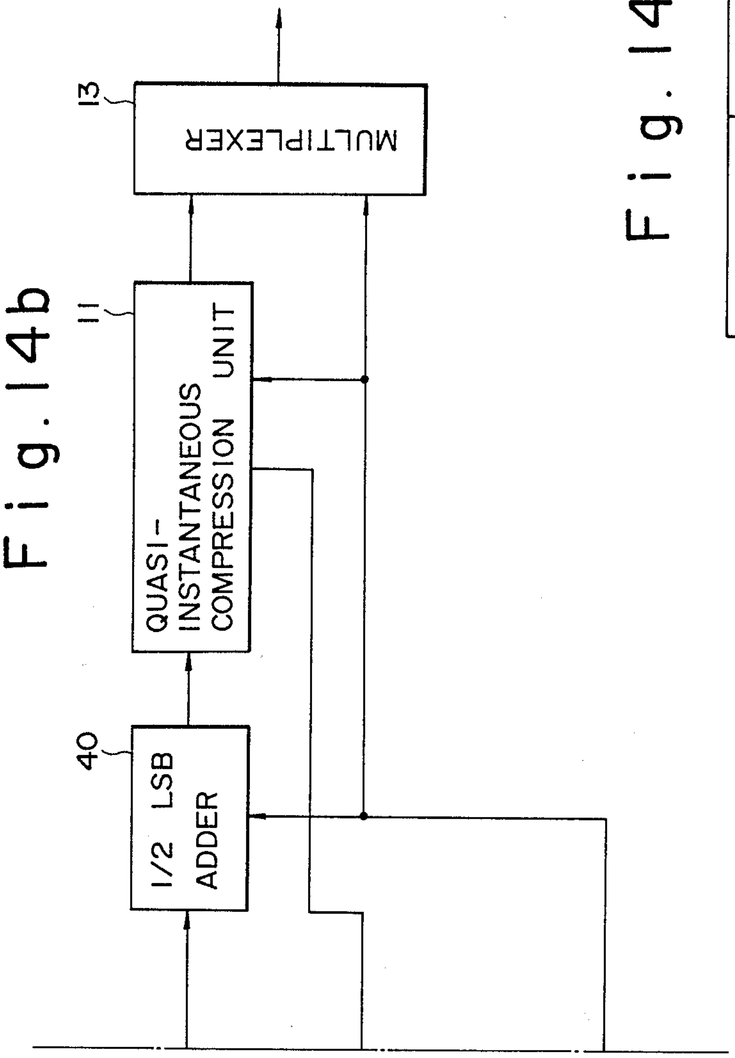
Figure 14:
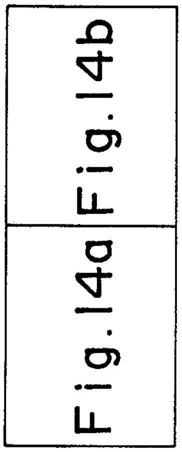
FIG. 14 illustrates how to combine FIGS. 14*a* and 14*b*.

FIGS. 14a and 14b show in block form another embodiment of this aspect of the present invention. Since this embodiment is similar to the embodiment shown in FIGS. 13a and 13b, like elements are indicated by like numerals. This embodiment differs from the previous embodiment shown in FIGS. 13a and 13b in that the A/D converted data is stored in the buffer 3 to carry out coding while the scale value is being determined. As a result, the controller 41 of the previous embodiment can be replaced by adders 42 and 43 and a maximum value limiting circuit 44 as connected as shown in FIGS. 14a and 14b, thereby allowing to carry out a real time processing.

Figures 15, 15A:
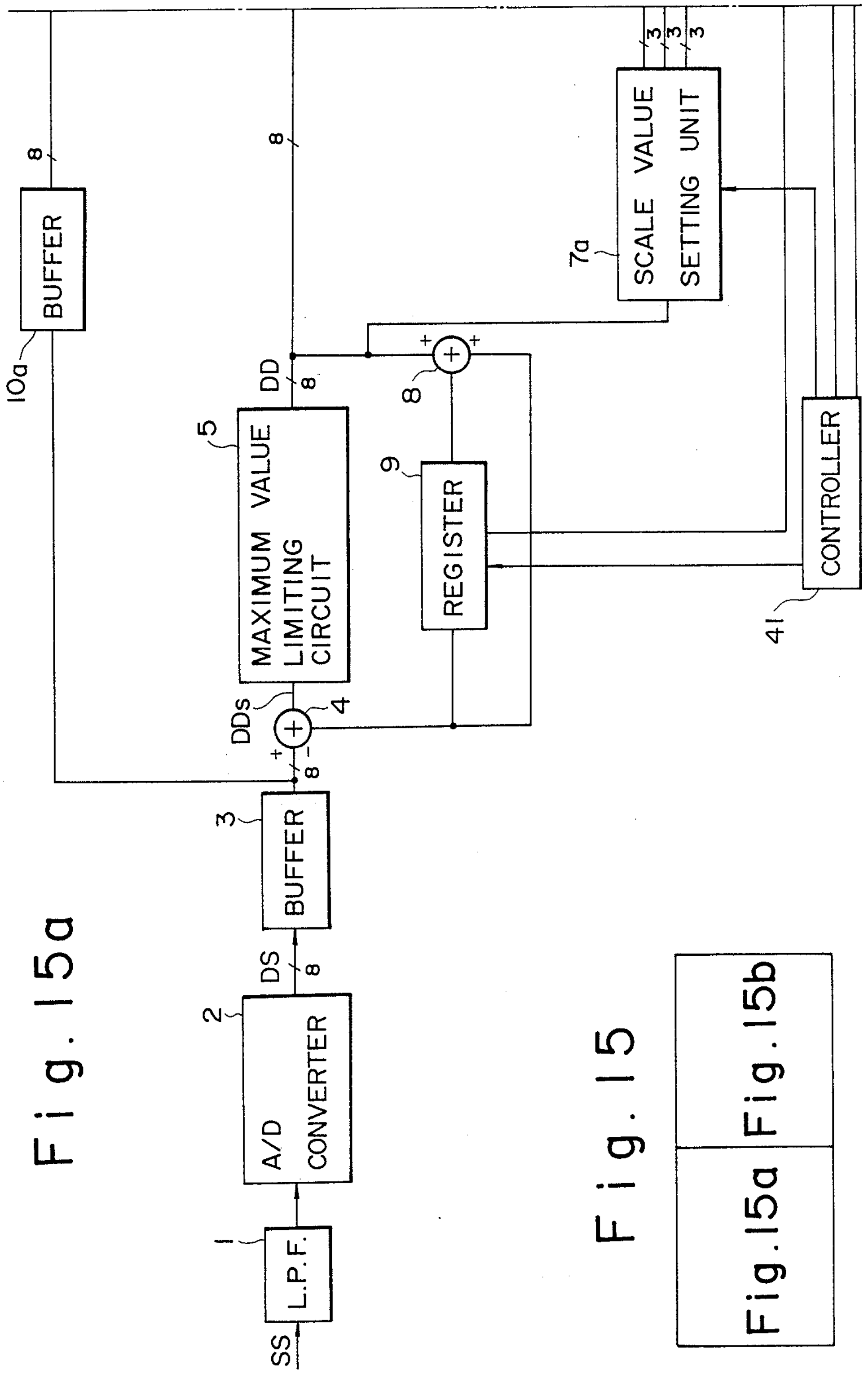
FIG. 15 illustrates how to combine FIGS. 15*a* and 15*b*.
FIGS. 15*a* and 15*b*, when combined as illustrated in FIG. 15, show in block form a voice signal compression coding system constructed in accordance with a still further embodiment of the present invention.
Figure 15B:
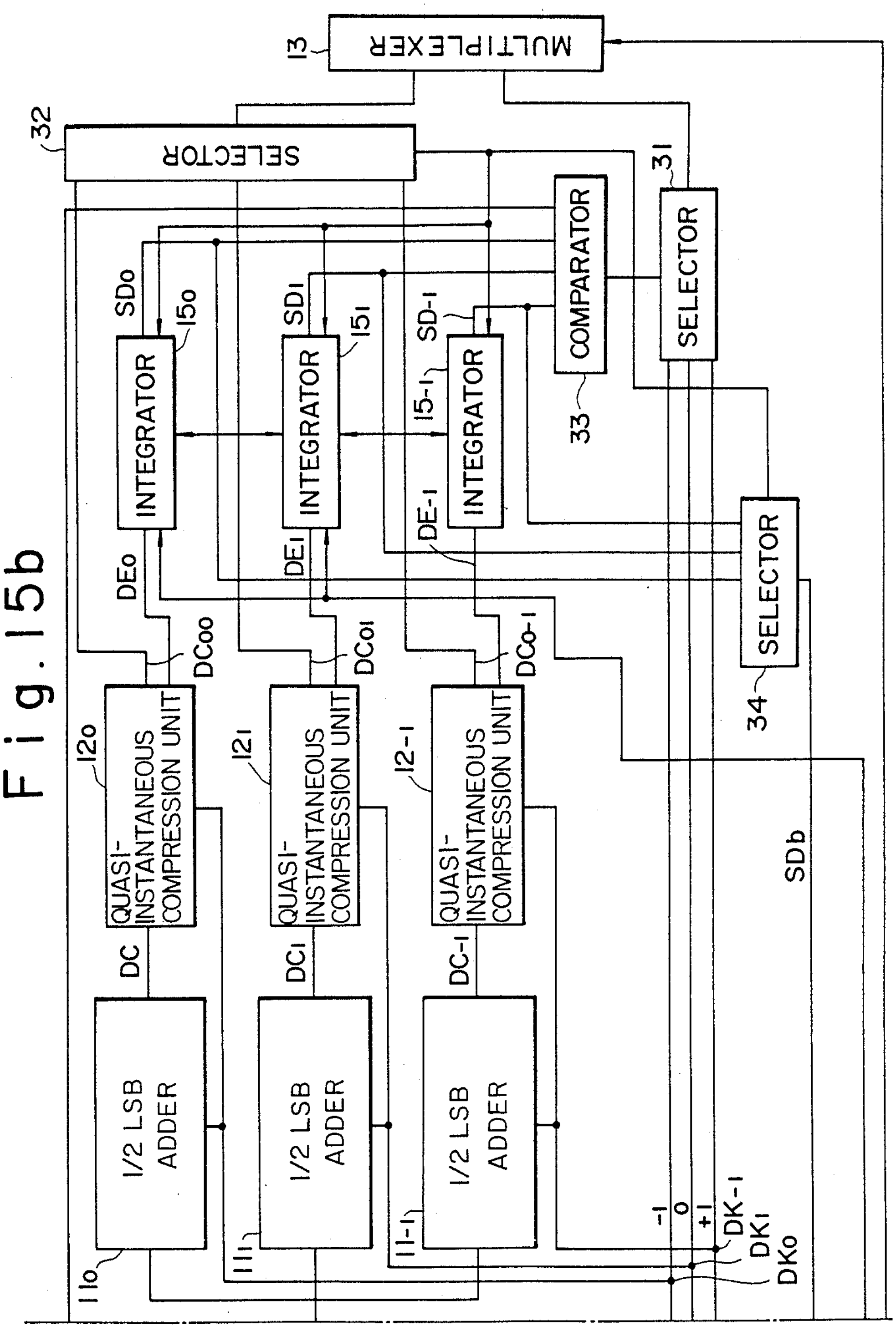

FIGS. 15a and 15b show a further embodiment of this aspect of the present invention and this embodiment is an improvement over the prior art shown in FIG. 9 by the application of the present novel structure shown in FIGS. 13a and 13b. The operation of each of the elements shown in FIGS. 15a and 15b is the same as that of each of those elements shown and described with reference to FIGS. 9 and 13a and 13b. In the present embodiment, it is so structured to add −1, 0 and +1 to the scale value and to select one closest to the original voice for each block. Upon completion of one block, the data to be integrated of the scale value selected by a comparator 33 is supplied to each of the other two integrators.

Figure 16A:
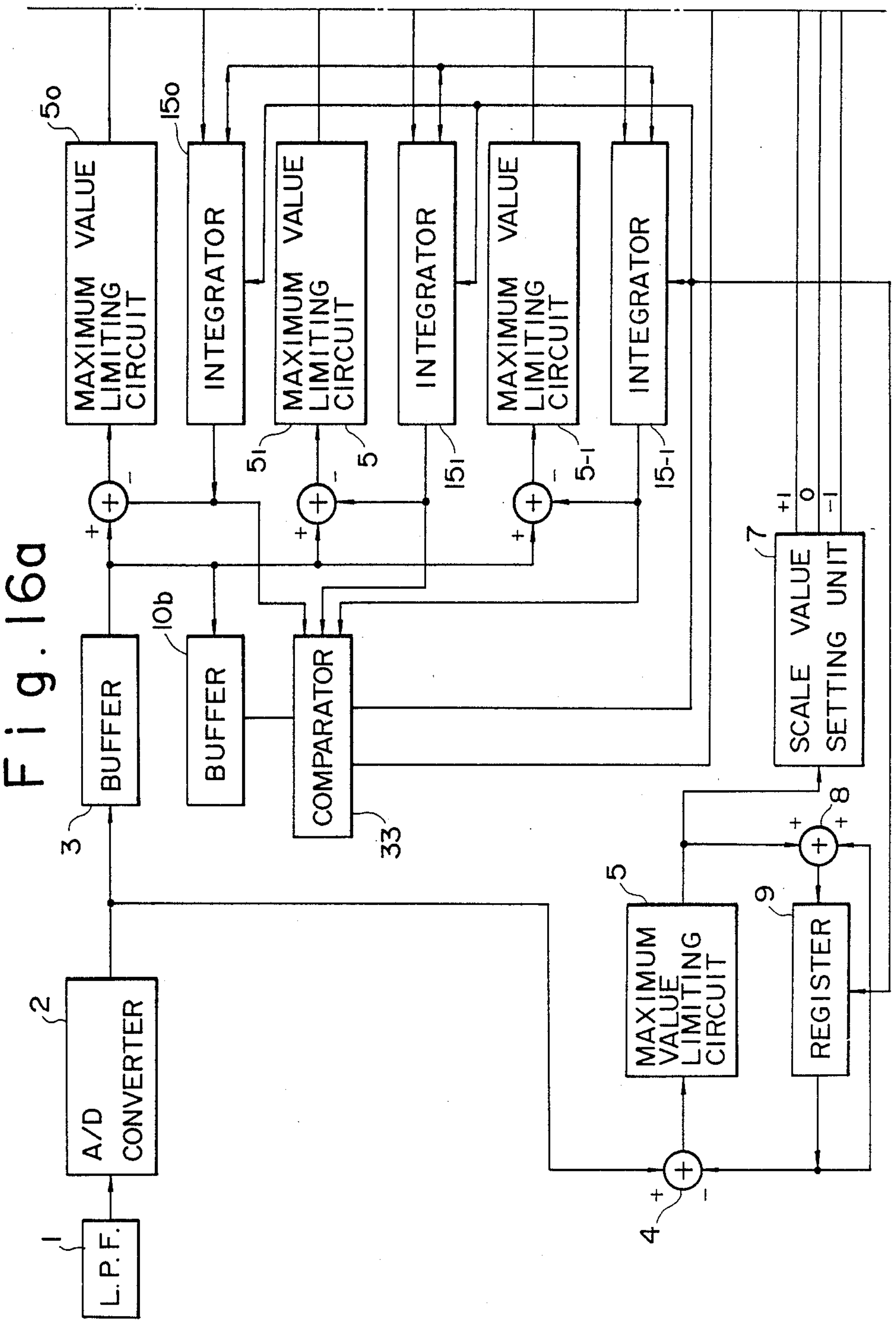
FIGS. 16*a* and 16*b*, when combined as illustrated in FIG. 16, show in block form a voice signal compression coding system constructed in accordance with a still further embodiment of the present invention.
Figures 16, 16B:
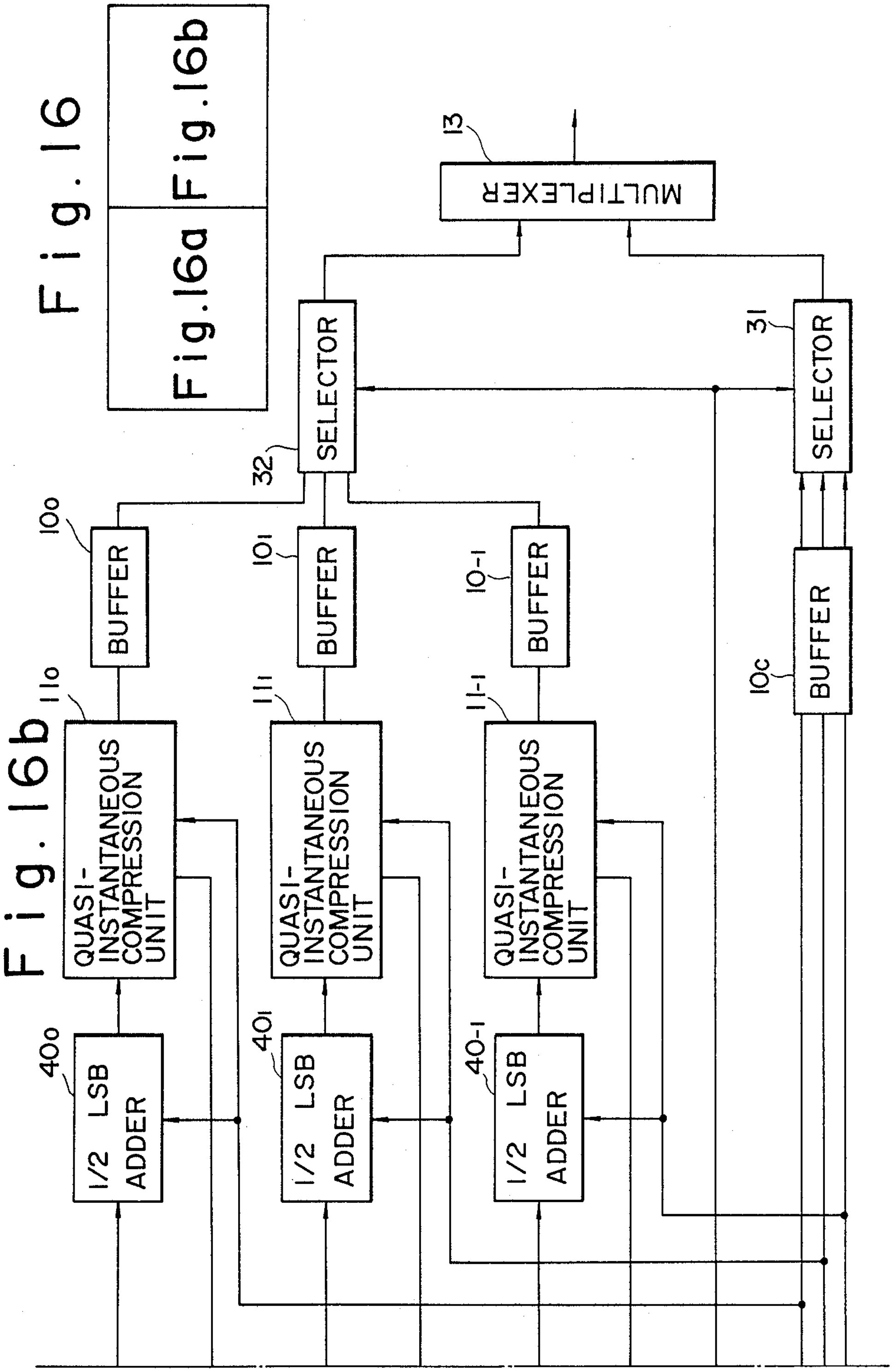
FIG. 16 illustrates how to combine FIGS. 16*a* and 16*b*.

FIGS. 16a and 16b show a still further embodiment of this aspect of the present invention, and this embodiment is an improvement over the prior art shown in FIG. 9 by applying the novel structure shown in FIGS. 14a and 14b. The operation of each of the elements shown in FIGS. 16a and 16b is the same as that of each of the elements shown in FIGS. 9 and FIGS. 14a and 14b. In the present embodiment, it is so structured to add −1, 0 and +1 to the scale value and to select one closest to the original voice for each block. Upon completion of one block, the data to be integrated of the scale value selected by a comparator 33 is supplied to each of the other two integrators.

Figure 17:
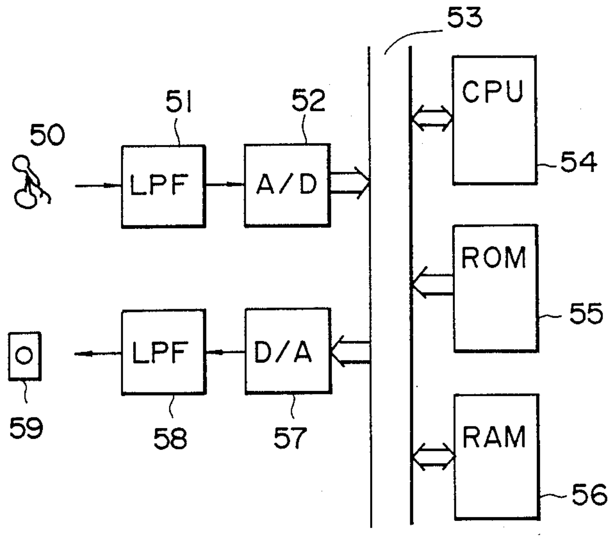
FIG. 17 is a block diagram showing a voice coding/decoding system constructed in accordance with a still further embodiment of the present invention.
Figure 18:
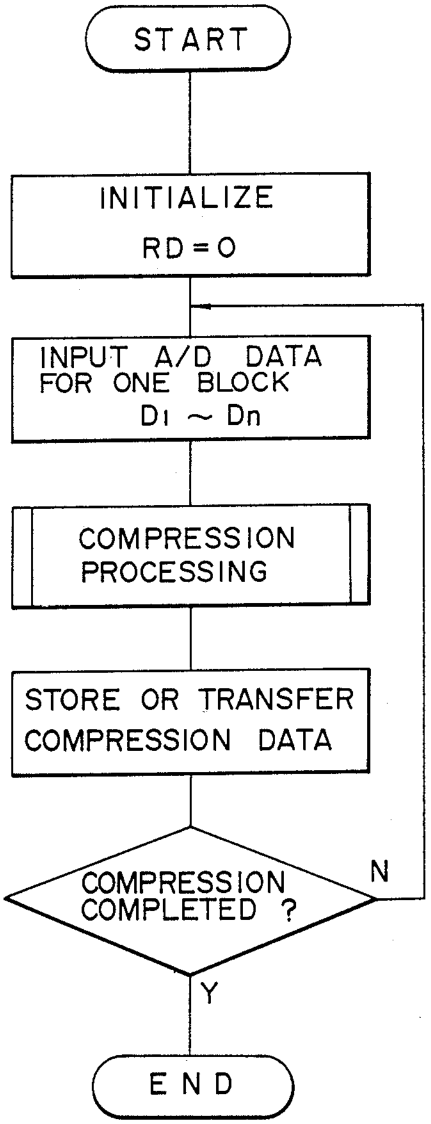
FIGS. 18 and 19 is a flow chart showing a sequence of steps of a voice coding method constructed in accordance with a still further embodiment of the present invention to be implemented in the system shown in FIG. 17.
Figure 19:
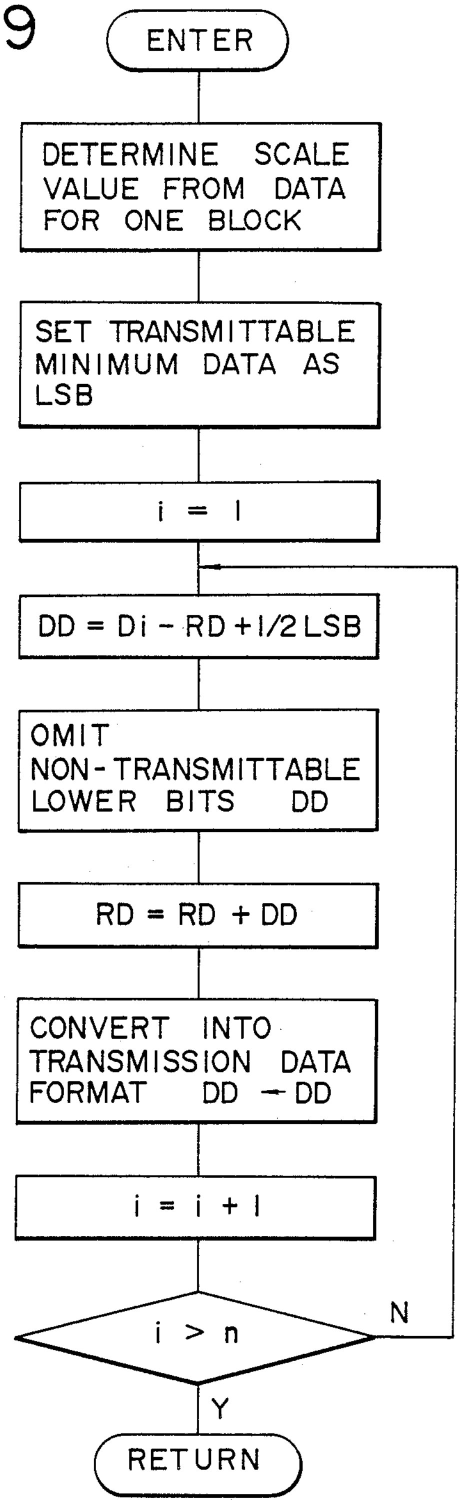

As described above, in accordance with this aspect of the present invention, a high quality voice compression coding process can be carried out at high speed and with low bit rate. In addition, since the processing is significantly simplified, the processing can be carried out by software using a CPU. FIG. 17 illustrates such a system and it includes a microphone 50, a low pass filter 51, an A/D converter 52, a data bus 53, a CPU 54, a ROM 55, a RAM 56, a D/A converter 57, a low pass filter 58 and a speaker 59. FIG. 18 shows a flow chart of the overall process and FIG. 19 is a flow chart showing the sequence of steps for the process of compression processing. The data compression processing of the present invention can be carried out within the CPU 54 by software.

Figures 21, 21A:
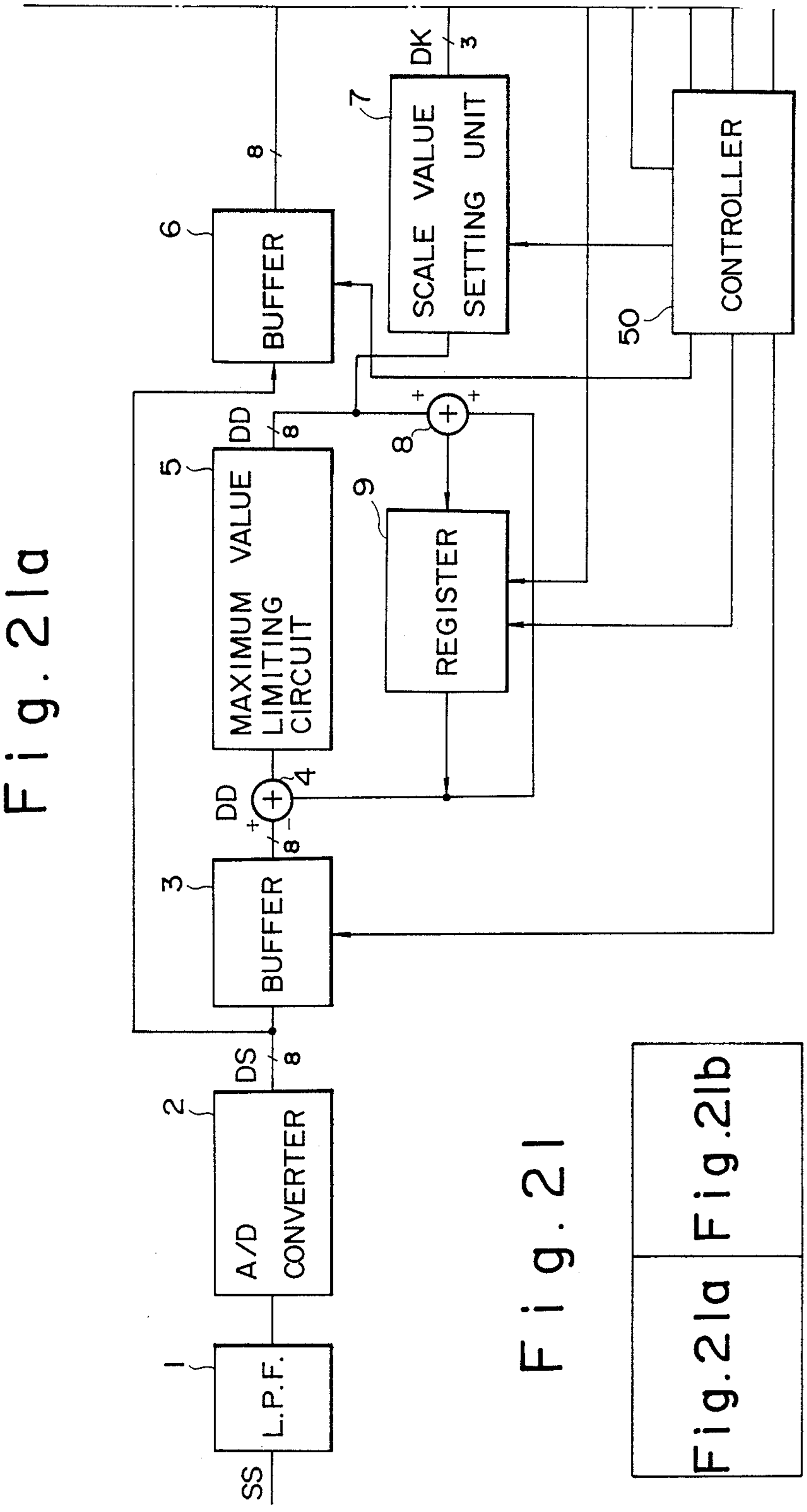
FIG. 21 illustrates how to combine FIGS. 21*a* and 21*b*.
FIGS. 21*a* and 21*b*, when combined as illustrated in FIG. 21, show in block form a voice signal compression coding system constructed in accordance with a still further embodiment of the present invention.
Figure 21B:
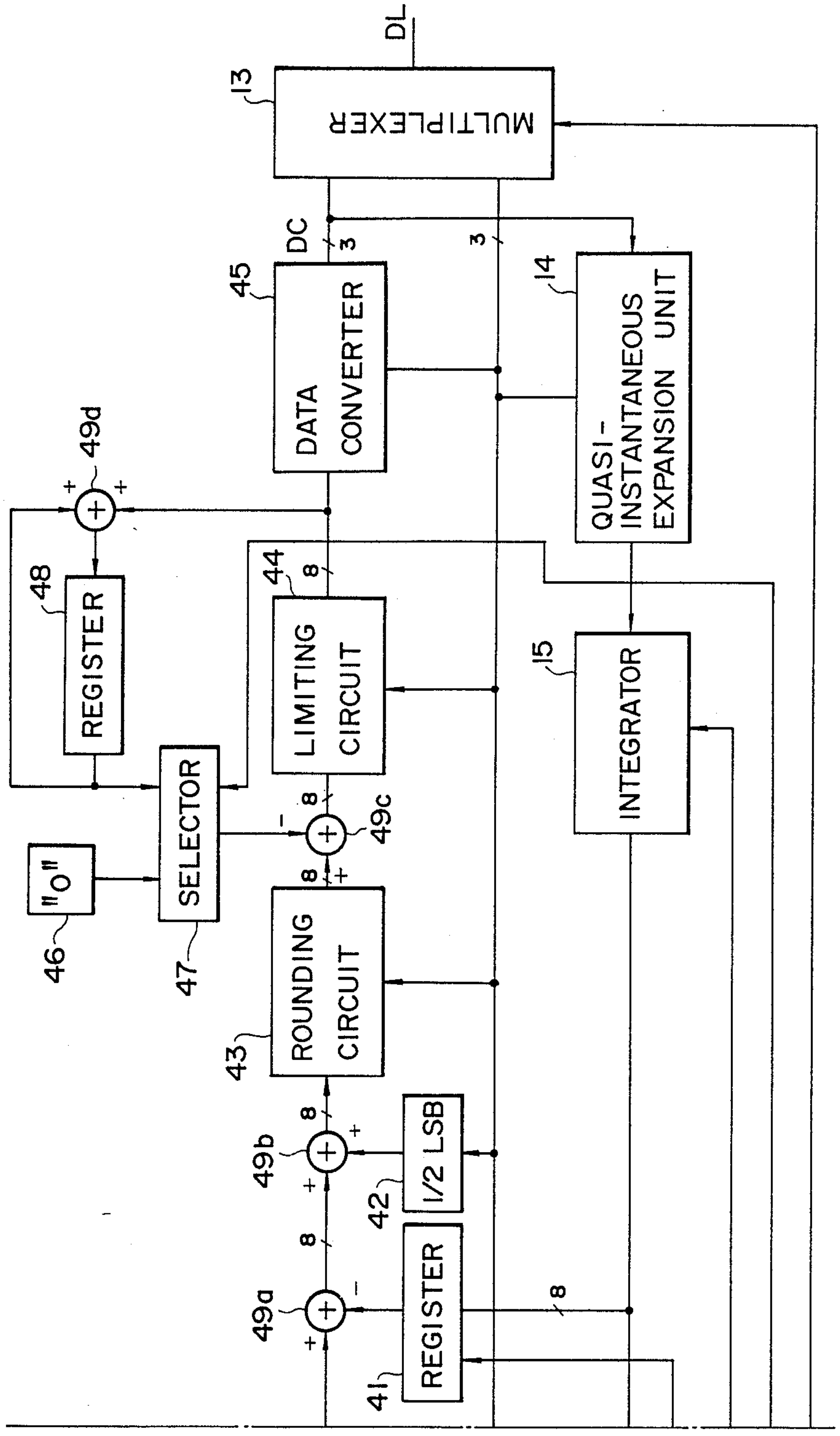

A further aspect of the present invention will now be described. FIGS. 21a and 21b show in block form a voice signal compression system constructed in accordance with an embodiment of this aspect of the present invention. It is to be noted that those elements which are identical to those elements disclosed in FIGS. 1a and 1b are indicated by identical numerals. The illustrated system has been constructed particularly by improving the quasi instantaneous compression unit, optimization processing unit and quasi instantaneous expansion unit. As shown, the present system additionally includes a register 41, a ½ LSB unit 42, a rounding unit 43, a limiting circuit 44, a data converter 45, a "0" setting unit 46, a selector 47, a register 48, adders 49*a* through 49*d*, and a controller 50.

Now, describing the case in which one block is formed by eight samples as shown in FIG. 2 and a voice waveform has a shape as shown in FIG. 3*a*, since data P11 of sample #1 is closer to P13 as compared with P12, P13 is selected. Data P21 of sample #2 is closer to P23 as compared with P22, P23 is selected. That is, grid points are determined for each minimum value (also called LSB) which can be transmitted from the last data of the previous block, a closer grid point closer to the voice waveform is selected for each sample, and differences between the selected grid points are transmitted. As an alternative, it may also be so structured as a scheme for selecting a closer grid point to add ½ of LSB and discard those bits smaller than LSB.

FIGS. 22*a* through 22*h* illustrate the procedure of the above-described calculation with A/D conversion being carried out by eight bits and compression to three bits being carried out. The last data of the preceding block is assumed to be 0000110. FIG. 22*a* shows the data obtained by subjecting a voice data to A/D conversion. FIG. 22*b* shows the data obtained by taking differences with the previous sample. The maximum of an absolute value of the data in this block is #8 and the scale value is $b_4$. In FIG. 22*b*, the scale value is indicated by "POS." FIG. 22*c* shows the data obtained by taking differences with the last data 00000110 of the preceding block. FIG. 22*d* shows the data obtained by adding ½ LSB to the data of FIG. 22*c*. FIG. 22*e* shows the data after omitting the bits smaller than LSB from the data of FIG. 22*d*. FIG. 22*f* shows the data obtained by taking differences with the previous sample of the data of FIG. 22*d*. It is assumed that #1 is the same data as that of FIG. 22*e*. FIG. 22*g* shows the data obtained by effecting the quasi instantaneous compression at POS position to three bits, adding POS and transmitting one block. FIG. 22*h* shows the data which has been decoded at the receiver based on FIG. 22*g*.

In the structure shown in FIGS. 21*a* and 21*b*, a voice waveform SS is passed through a low pass filter 1 to thereby effect band compression to ½ or less of the sampling frequency of an A/D converter 2, and quantization is effected by the A/D converter 2. The thus A/D converted data DS is stored in a buffer 3 from where one block of data is passed through a maximum value limiting circuit 5 to produce differences of the data which are then supplied to a scale value setting unit 7. At the scale value setting unit 7, an absolute value of each differential data is taken, and from a maximum of such an absolute value is determined an effective MSB or scale value. At the same time, the A/D converted data is stored in a buffer 6 to calculate differences with the last decoded data of the preceding block, and ½ LSB is added to the differential data while discarding those bits smaller than LSB at the rounding circuit 43. It is so structured that a difference of outputs from the rounding circuit 43 is taken so as to prevent the limiting circuit 44 from overflowing when the quasi instantaneous compression is carried out.

Since no difference is taken for the data at the beginning of a block, the value to be subtracted is set at "0" by the selector 47. The differential data is processed at the data converter 45 to reduce the bit width and then output through the multiplexer 13 as being mixed, together with the scale value. Then, local decoding is carried out for the outputting data by the quasi instantaneous expansion unit 14 and the integrator 15, and the last data of the block is set in each of the registers. The controller 50 switches between the operation for determining the scale value and the operation for carrying out coding. In the case of determining the scale value, while stopping the output operation of the integrator 15 and of the multiplexer 13 and also the operation of the buffer 6, the input of the register 9 is switched to the adder 8 and the buffer 3 and the scale value setting unit 7 are rendered active. On the other hand, in the case of implementing the coding operation, while causing the output operation of the integrator 15 and multiplexer 13 and also the operation of the buffer 6 to be active, the operation of the buffer 3 is stopped and the operation of the scale value setting unit 7 is also stopped to thereby retain the output of the scale value. In addition, when coding the first word of a block, the selector is switched to "0" and the output of the integrator is output to each of the registers.

Figures 23, 23A:
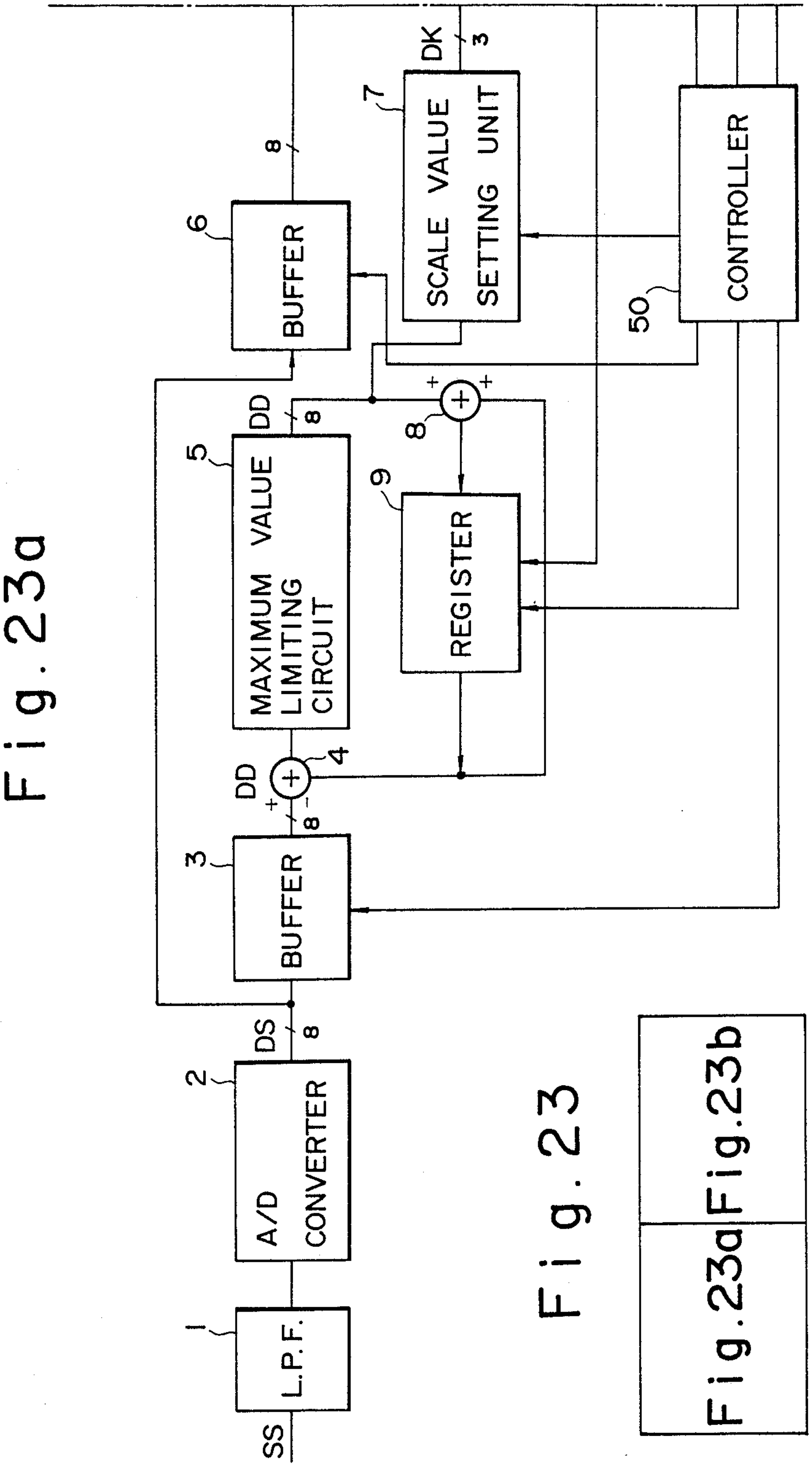
FIG. 23 illustrates how to combine FIGS. 23*a* and 23*b*.
FIGS. 23*a* and 23*b*, when combined as illustrated in FIG. 23, show in block form a voice signal compression coding system constructed in accordance with a still further embodiment of the present invention.
Figure 23B:
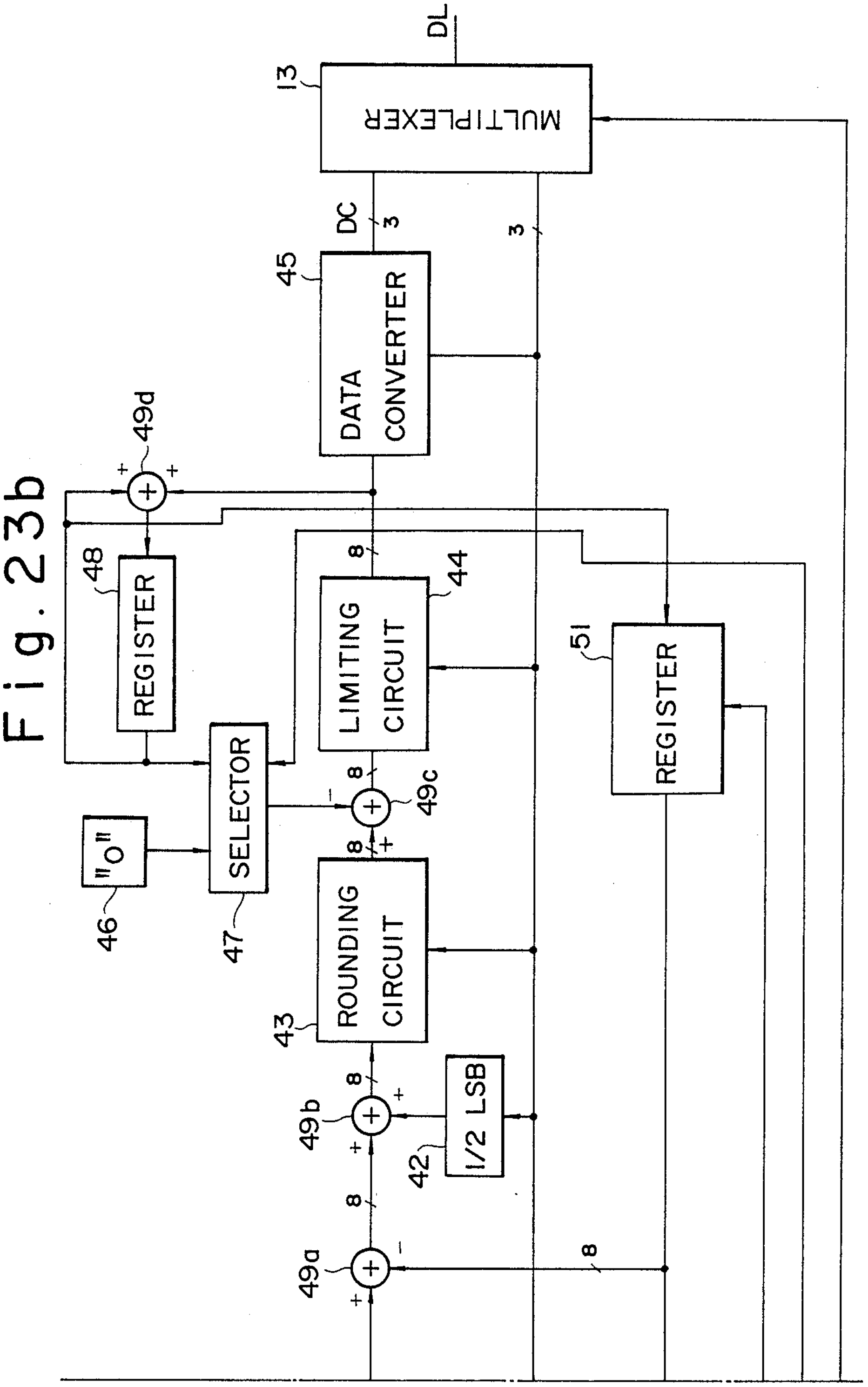

FIGS. 23*a* and 23*b* show another embodiment of this aspect of the present invention, which has been constructed by removing the local decoding portion in the embodiment shown in FIGS. 21*a* and 21*b*. Thus, the present embodiment is similar to the embodiment shown in FIGS. 21*a* and 21*b*, so that like elements are indicated by like numerals. The present embodiment differs from the previous embodiment shown in FIGS. 21*a* and 21*b* in that an output of the register 48 as the last data of the preceding block is stored into the register 51 at the end of the block. With this structure, the quasi instantaneous expansion unit 14 and the integrator 15, which are required in the embodiment of FIGS. 21*a* and 21*b*, are removed.

Figures 24, 24A:
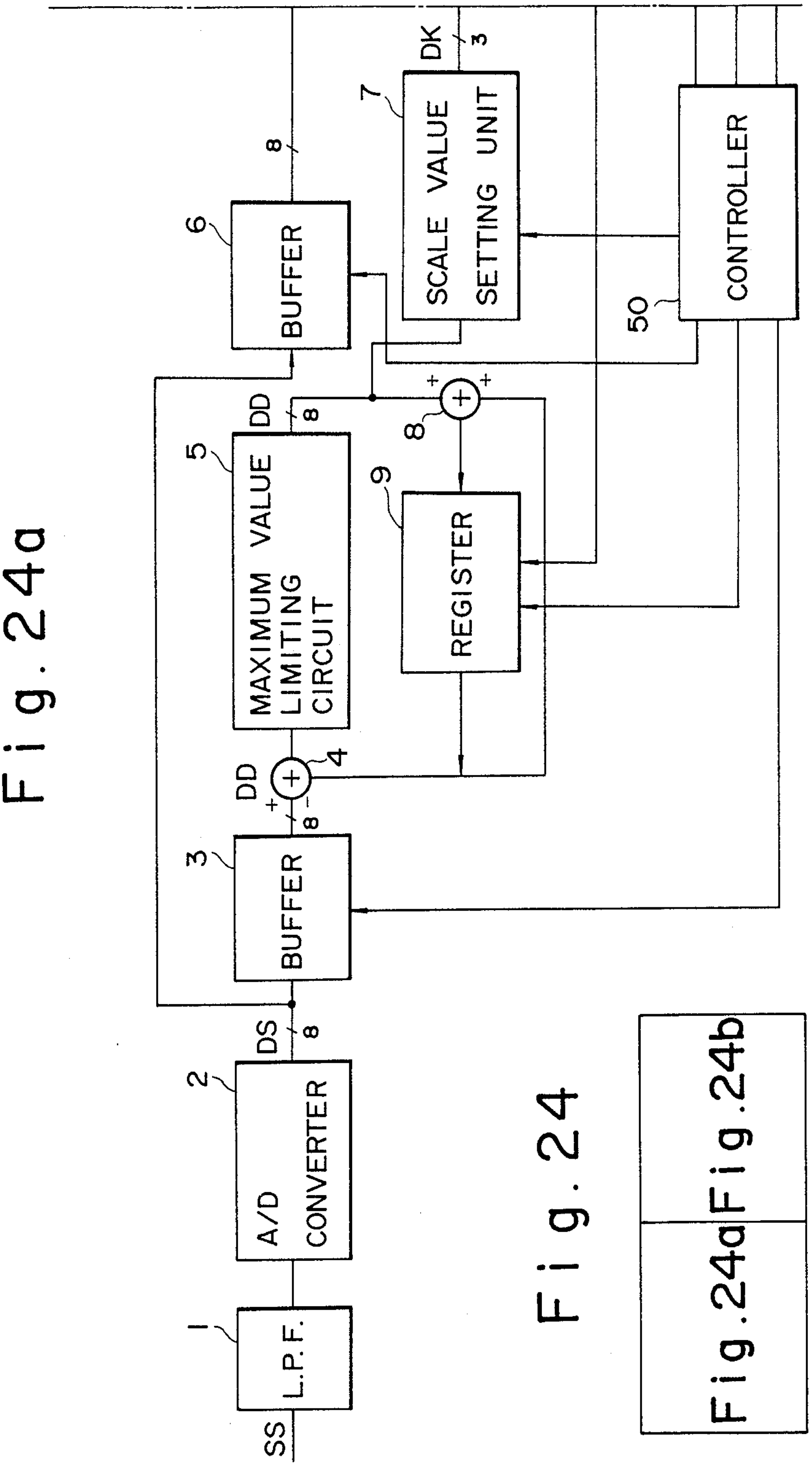
FIG. 24 illustrates how to combine FIGS. 24*a* and 24*b*.
FIGS. 24*a* and 24*b*, when combined as illustrated in FIG. 24, show in block form a voice signal compression coding system constructed in accordance with a still further embodiment of the present invention.
Figure 24B:
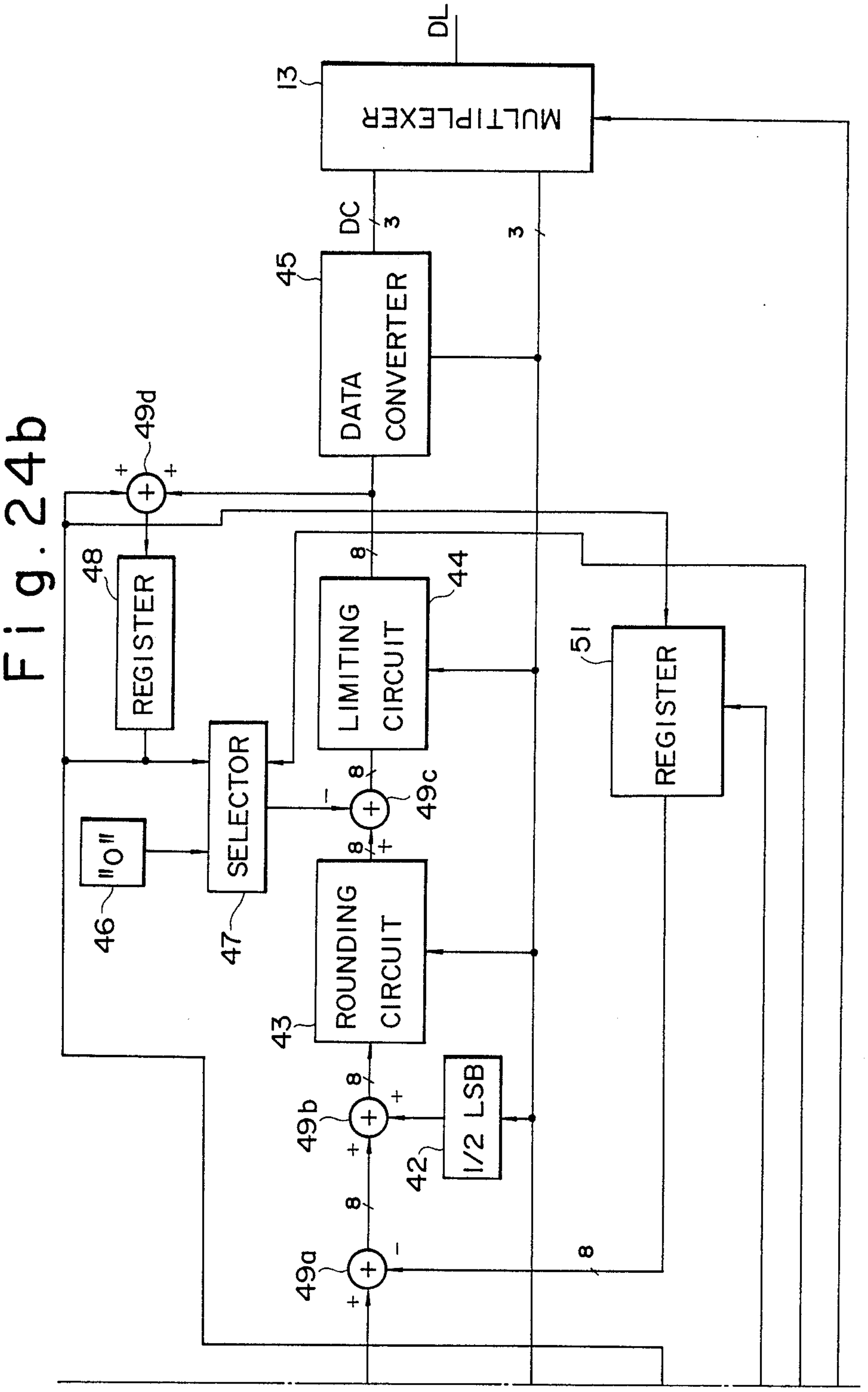

FIGS. 24*a* and 24*b* show in block form a further embodiment of this aspect of the present invention, which has been constructed by modifying the structure shown in FIGS. 23*a* and 23*b*. In the embodiment shown in FIGS. 23*a* and 23*b*, in order to supply a data to the register 9, an output of the register 48 is supplied through the register 51; whereas, in the present embodiment, a data is supplied directly from the register 48 to the register 9, so that the procedure of the controller 50 is simplified from a two-step structure to a single-step structure.

Figures 25, 25A:
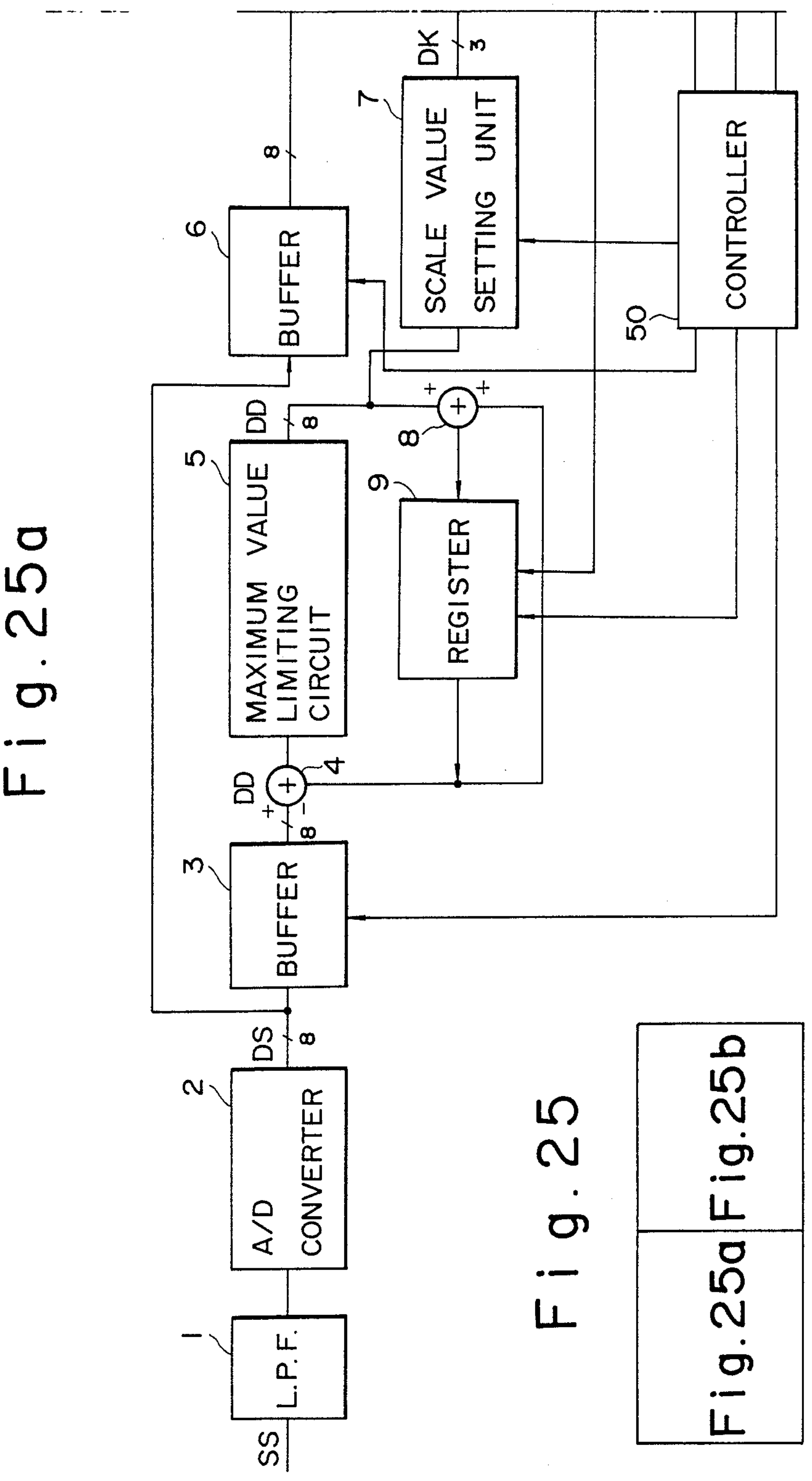
FIG. 25 illustrates how to combine FIGS. 25*a* and 25*b*.
FIGS. 25*a* and 25*b*, when combined as illustrated in FIG. 25, show in block form a voice signal compression coding system constructed in accordance with a still further embodiment of the present invention.
Figure 25B:
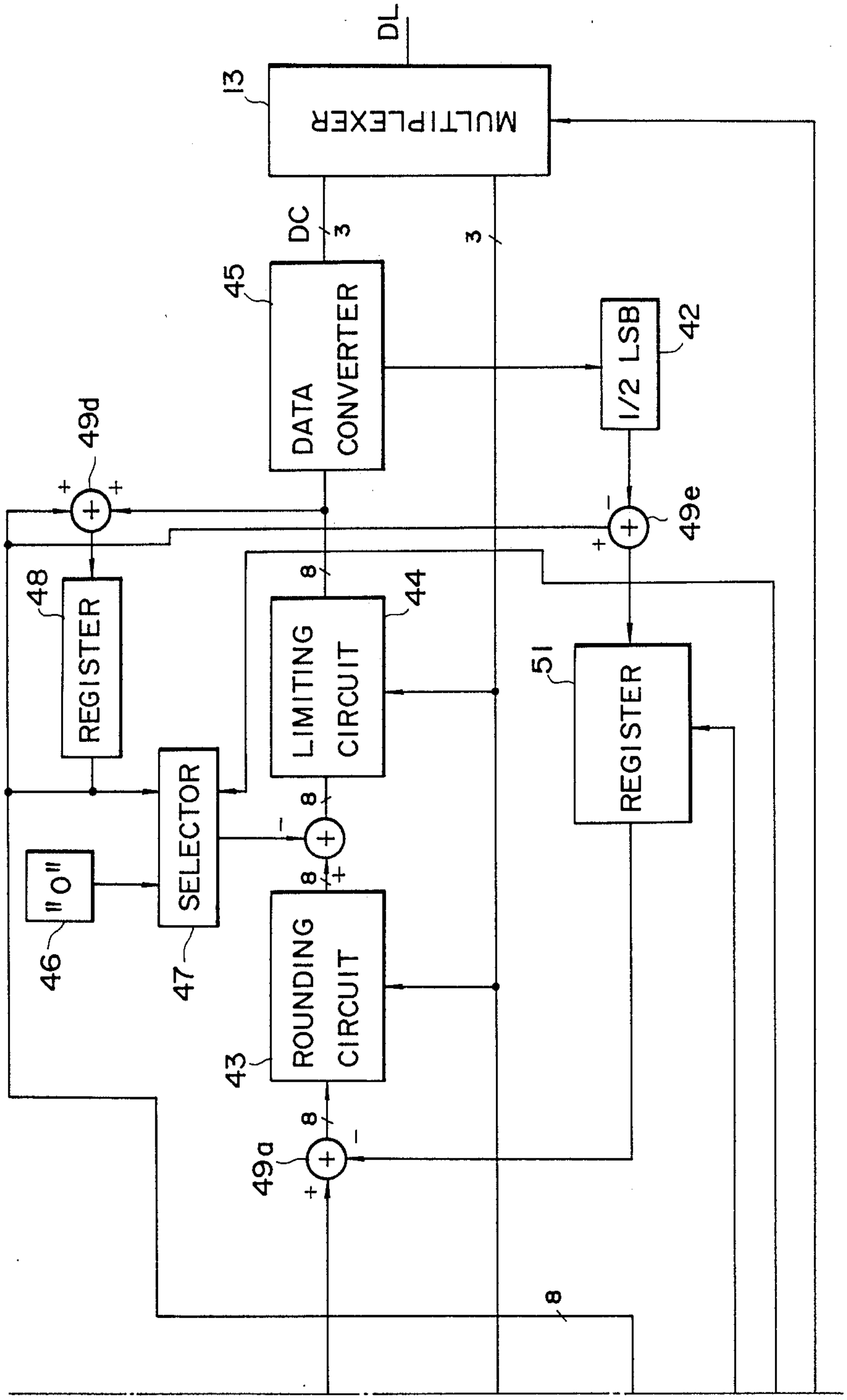

FIGS. 25*a* and 25*b* show in block form a still further embodiment of this aspect of the present invention, which has been constructed by modifying the structure shown in FIGS. 24*a* and 24*b*. That is, in the embodiment shown in FIGS. 24*a* and 24*b*, a data passes through two adders between the buffer 6 and the rounding circuit 43. On the other hand, a data passed through an adder only once. This is because the same result can be obtained by adding the data from which ½ LSB has been subtracted to the last data of the preceding block.

Similarly as described previously, each of the above-described embodiments of this aspect of the present invention is simple in process, so that the process may be implemented by using a general-purpose CPU and software, if desired.

While the above provides a full and complete disclosure of the preferred embodiments of the present invention, various modifications, alternate constructions and equivalents may be employed without departing from the true spirit and scope of the invention. Therefore, the above description and illustration should not be construed as limiting the scope of the invention, which is defined by the appended claims.

What is claimed is:

1. A voice signal coding method, comprising the steps of:
dividing PCM coded voice data into blocks in timed sequence, each block having a predetermined number of data;
determining the signal absolute values of the data in each block;
determining the maximum value of the signal absolute values in each of the blocks, each maximum value corresponding to a most significant bit;
identifying scale data which represents the most significant bit in each of the blocks;
forming code data from a predetermined number of bits of data including said most significant bit to thereby have said voice data compressed; and
correcting said code data such that an error between a decoded value of said code data and voice data corresponding to said code data is minimized.

2. A voice signal coding method, comprising the steps of:
forming difference values between adjacent samples among PCM coded voice data;
dividing said difference values into blocks in timed sequence, each block having a predetermined number of difference values;
determining the absolute value of the difference values in each of the blocks;
determining the maximum value in the absolute values in each of the blocks, each maximum value corresponding to a most significant bit;
identifying scale data which represents the most significant bit in each of the blocks;
forming code data from a predetermined number of bits of data containing said most significant bit to thereby have said voice data compressed; and
correcting said code data such that an error between a decoded value of said code data and voice data corresponding to said code data is minimized, whereby, when a difference value for a first sample of the following block is to be calculated, a decoded value of a last sample of the current block is used as a reference.

3. The method of claim 2, wherein said difference value is limited in a maximum value of an absolute value thereof.

4. A voice signal coding method, comprising the steps of:
dividing PCM coded voice data into blocks in a timed sequence, each block having a predetermined number of data;
determining the signal absolute values of the data in each block;
determining the maximum value of the signal absolute values in each of the blocks, each maximum value corresponding to a most significant bit;
identifying scale data which represents the most significant bit in each of the blocks;
forming code data from a predetermined number of bits of data containing said most significant bit to thereby have said voice data compressed;
forming a plurality of code data series by defining said code data based on a plurality of scale data corresponding to said most significant bit and bits adjacent to said most significant bit;
correcting each of said plurality of code data series such that an error between a decoded value corresponding to an individual code data defining each of said code data series and voice data corresponding to said code data is minimized; and
selecting among said corrected code data series a code data series having a minimum error within a block as the code data series of said block.

5. The method of claim 4, wherein said error is an error power within a block of an individual code data series.

6. The method of claim 4, wherein said error is a sum of an absolute value of an error in each sample within a block of an individual code data series.

7. A voice signal coding method, comprising the steps of:
forming difference values between adjacent samples among PCM coded voice data;
dividing said difference values into blocks in timed sequence, each block having a predetermined number of difference values;
determining the absolute value of the difference values in each of the blocks;
determining the maximum value in the absolute values in each of the blocks, each maximum value corresponding to a most significant bit;
identifying scale data which represents the most significant bit in each of the blocks;
forming code data from a predetermined number of bits of data containing said most significant bit to thereby have said voice data compressed;
forming a plurality of code data series by defining said code data based on a plurality of scale data corresponding to said most significant bit and bits adjacent to said most significant bit;
correcting each of said plurality of code data series such that an error between a decoded value corresponding to an individual code data defining each of said code data series and voice data corresponding to said code data is minimized; and
selecting among said corrected code data series a code data series having a minimum error power within a block as a code data series of said block, whereby when a difference value for a first sample of the following block is to be calculated, a decoded value of a last sample of the thus selected code data series of the current block is used as a reference.

8. The method of claim 7, wherein said error is an error power in a block of each code data series.

9. The method of claim 7, wherein said error is a sum of an absolute value of an error of each sample within a block of each code data series.

10. The method of claim 7, wherein said difference value is limited in a maximum value of an absolute value thereof.

11. A voice signal compressing method, comprising the steps of:
defining differences of PCM coded voice data;
dividing said differences into blocks each of which has a predetermined number of differences;
determining the absolute values of the differences in each block;
determining the maximum value of the absolute values in each of the blocks, each maximum value corresponding to a most significant bit;
identifying scale data which represents the most significant bit in each block;
forming code data from a predetermined number of bits of data including said most significant bit; and correcting said code data such that an error between a decoded data of said code data and an original voice signal is minimized, whereby said correction is carried out by a quasi instantaneous compression scheme while adding ½ of an effective smallest value in the code data to said differences.

12. The method of claim 11, wherein, when defining a difference for a first data of each of the blocks, use is made of a last coded data of the preceding block.

13. The method of claim 11, wherein a difference is taken between a decoded data of a coded data on the basis of the scale data and the next original voice data.

14. The method of claim 11, wherein the scale data is determined in advance for three kinds of +1, 0 and −1, and the code data whose decoded data is closest to the original voice is adopted.

15. The method of claim 14, wherein a value of a decoding unit within a coding system, in which a code data has beed adopted at the end of each block, is transferred to another decoding unit.

16. The method of claim 14, wherein, when taking a first difference in each block, use is made of a last decoded data of the preceding block.

17. The method of claim 4, wherein a difference is taken between a decoded data which has been coded based on the scale data and the next original voice.

18. A voice signal compressing method, comprising the steps of:

defining differences of PCM coded voice data;

dividing said differences into blocks each of which has a predetermined number of differences;

determining the absolute values of the differences in each block;

determining the maximum value of the absolute values in each of the blocks, each maximum value corresponding to a most significant bit;

identifying a scale value which represents the most significant bit in each block;

forming code data from a predetermined number of bits of data including said most significant bit; and correcting said code data such that an error between a decoded data of said code data and an original voice signal is minimized, wherein an improvement resides in the steps of:

subtracting a last data of the preceding block from a value of each sample point;

adding ½ of an effective smallest value among the code data;

carrying out a quasi instantaneous compression process based on a predetermined scale value; and outputting a difference of compressed results.

19. The method of claim 18, wherein, when determining the scale value of each block, use is made of a last decoded data of the preceding block to define a difference of a first data of each block.

20. The method of claim 18, wherein with ½ of an effective smallest value in the code data being subtracted from a last data of the preceding block, this value is subtracted from the data of each sample.

* * * * *